(12) United States Patent
Lee et al.

(10) Patent No.: US 12,495,719 B2
(45) Date of Patent: Dec. 9, 2025

(54) HEAT CONVERSION DEVICE AND POWER GENERATION SYSTEM COMPRISING SAME

(71) Applicant: LG INNOTEK CO., LTD., Seoul (KR)

(72) Inventors: Seung Yong Lee, Seoul (KR); Myoung Lae Roh, Seoul (KR); Un Hak Lee, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 272 days.

(21) Appl. No.: 18/251,434

(22) PCT Filed: Nov. 3, 2021

(86) PCT No.: PCT/KR2021/015803
§ 371 (c)(1),
(2) Date: May 2, 2023

(87) PCT Pub. No.: WO2022/098088
PCT Pub. Date: May 12, 2022

(65) Prior Publication Data
US 2024/0008366 A1  Jan. 4, 2024

(30) Foreign Application Priority Data

Nov. 4, 2020 (KR) ......................... 10-2020-0146128

(51) Int. Cl.
*H10N 10/13* (2023.01)
*H10N 10/17* (2023.01)

(52) U.S. Cl.
CPC ............. *H10N 10/13* (2023.02); *H10N 10/17* (2023.02)

(58) Field of Classification Search
None
See application file for complete search history.

(56) References Cited

U.S. PATENT DOCUMENTS

| | | | | |
|---|---|---|---|---|
| 2014/0048114 A1* | 2/2014 | Simonin | ............... | H10N 10/13 |
| | | | | 136/209 |
| 2019/0178141 A1* | 6/2019 | Kim | .................... | F28D 21/0003 |

(Continued)

FOREIGN PATENT DOCUMENTS

| | | | | |
|---|---|---|---|---|
| DE | 102012215445 A1 * | 5/2014 | ............. | H01L 37/00 |
| JP | 2017-539074 A | 12/2017 | | |
| KR | 10-2019-0065763 A | 6/2019 | | |

(Continued)

OTHER PUBLICATIONS

English language machine translation of DE-102012215445-A1. (Year: 2024).*

(Continued)

*Primary Examiner* — Eli S Mekhlin
(74) *Attorney, Agent, or Firm* — Saliwanchik, Lloyd & Eisenschenk

(57) ABSTRACT

An embodiment of the present invention provides a heat conversion device comprising: a frame comprising a plurality of second through holes; and one or more thermoelectric devices connected to the frame, wherein the width of each of the plurality of second through holes is smaller than the distance between through holes which are closest to each other from among the plurality of second through holes.

8 Claims, 23 Drawing Sheets

(56) References Cited

U.S. PATENT DOCUMENTS

2019/0195110 A1     6/2019  Dominguez et al.
2021/0234082 A1*    7/2021  Lee ........................ H10N 10/01

FOREIGN PATENT DOCUMENTS

WO        2013/112710  A1      8/2013
WO    WO-2019112288  A1 *   6/2019    ........... H01L 23/367
WO        2019/194595  A1     10/2019

OTHER PUBLICATIONS

International Search Report dated Feb. 7, 2022 in International Application No. PCT/KR2021/015803.

* cited by examiner

FIG. 3
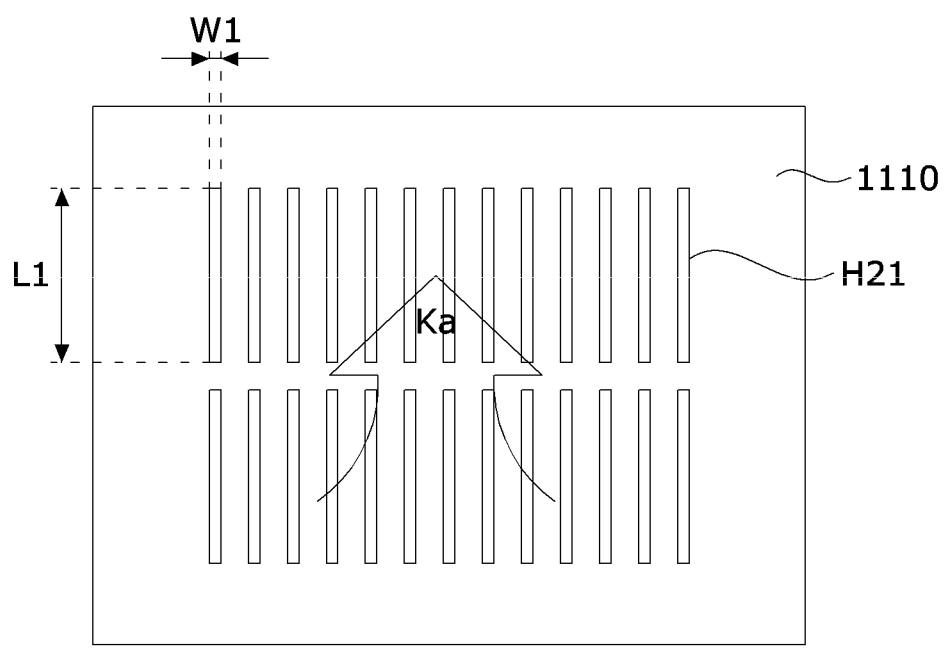
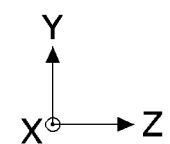

FIG. 24

HEAT CONVERSION DEVICE AND POWER GENERATION SYSTEM COMPRISING SAME

CROSS-REFERENCE TO RELATED APPLICATIONS

This application is the U.S. national stage application of International Patent Application No. PCT/KR2021/015803, filed Nov. 3, 2021, which claims the benefit under 35 U.S.C. § 119 of Korean Application No. 10-2020-0146128, filed Nov. 4, 2020, the disclosures of each of which are incorporated herein by reference in their entirety.

TECHNICAL FIELD

The present invention relates to a heat conversion device and a power generation system including the same, and more specifically, to a heat conversion device (particularly, a Seebeck device) using a difference in temperature between a low-temperature part and a high-temperature part of a thermoelectric element, and a power generation system including the same.

BACKGROUND ART

A thermoelectric effect is a direct energy conversion between heat and electricity using a phenomenon occurring due to the movement of electrons and holes in a material.

A thermoelectric element is generally referred to as an element using the thermoelectric effect and has a structure in which P-type thermoelectric materials and N-type thermoelectric materials are disposed between and bonded to metal electrodes to form PN junction pairs.

Thermoelectric elements may be divided into elements using a temperature change according to electrical resistance, elements using the Seebeck effect in which an electromotive force is generated due to a difference in temperature, elements using the Peltier effect in which heat absorption or heating occurs due to a current, and the like.

Thermoelectric elements have been variously applied to home appliances, electronic components, communication components, and the like. As an example, thermoelectric elements may be applied to cooling apparatuses, heating apparatuses, power generation apparatuses, and the like. Therefore, the demand for the thermoelectric performance of thermoelectric elements is gradually increasing.

Recently, there have been needs to generate electricity using high-temperature waste heat, which is generated by engines of vehicles, vessels, and the like, and thermoelectric elements.

In this case, a problem that a power generation amount is not constant and is decreased according to a flow of a fluid can occur.

DISCLOSURE

Technical Problem

The present invention is directed to providing a heat conversion device which generates electricity using a difference in temperature between a lower-temperature part and a high-temperature part of a thermoelectric element, and a power generation system including the same.

In addition, the present invention is directed to providing a heat conversion device of which moisture resistance is improved without interference with a flow of a fluid, and a power generation system including the same.

In addition, the present invention is directed to providing a heat conversion device of which power generation performance is improved by uniformly generating power using fins, and a power generation system including the same.

Objectives to be addressed through embodiments are not limited thereto and may also include objectives and effects which may be understood from solutions or embodiments of the objectives which will be described below.

Technical Solution

One aspect of the present invention provides a heat conversion device including a frame including a plurality of second through holes, and at least one thermoelectric element connected to the frame, wherein a width of each of the plurality of second through holes is smaller than a width between closest through holes among the plurality of second through holes.

The heat conversion device may further include a fluid flow part coupled to the frame and including first through holes, wherein the plurality of second through holes and the first through holes may extend in a first direction and may be disposed to correspond to each other, the fluid flow part may include a first surface and a second surface facing each other, and the first through hole may pass through the first surface and the second surface.

At least one of the frame may be in contact with the first surface or the second surface.

A length of the second through hole in a second direction may be smaller than a length between adjacent second through holes in a third direction perpendicular to the second direction.

A length of the first through hole in a direction perpendicular to the first direction may be smaller than or equal to a length of the second through hole in the direction perpendicular to the first direction.

The length of the second through hole in the direction perpendicular to the first direction may be smaller than or equal to a length of the first surface or the second surface in the direction perpendicular to the first direction.

The length of the first through hole in the direction perpendicular to the first direction may be equal to the length of the second through hole in the direction perpendicular to the first direction.

The frame may include a first frame in contact with the first surface and a second frame in contact with the second surface, wherein the second through holes may include a 2-1 through hole disposed in the first frame and a 2-2 through hole disposed in the second frame.

A length of the 2-1 through hole in a direction perpendicular to the first direction may be equal to a length of the 2-2 through hole in the direction perpendicular to the first direction.

The thermoelectric element may include a first substrate in contact with one surface of the fluid flow part, a second substrate disposed to be spaced apart from the first substrate, a first electrode disposed on the first substrate, a second electrode disposed under the second substrate, and a plurality of thermoelectric legs disposed between the first electrode and the second electrode, The heat conversion device may further include a jacket in contact with the first substrate, a temperature of a first fluid passing through the first through hole may be higher than a temperature of a second fluid positioned in the jacket, and the first fluid may sequentially pass through the second through hole of the frame and the first through hole of the fluid flow part.

The jacket may include a first jacket disposed at one side of the fluid flow part and a second jacket disposed at the other side of the fluid flow part, and the first jacket and the second jacket may be disposed between the adjacent fluid flow parts and integrally formed.

The heat conversion device may further include at least one fin extending in the first direction and disposed in the first through hole.

The first through hole may include sub through holes divided by the at least one fin, and the number of the sub through holes in the first surface may be different from the number of the sub through holes in the second surface.

The number of the sub through holes may increase in the first direction.

Advantageous Effects

According to embodiments of the present invention, a power generation apparatus of which assembly is simple and the power generation performance is high can be obtained.

In addition, according to embodiments of the present invention, a heat conversion device of which moisture resistance is improved without interference with a flow of a fluid, and a power generation system including the same can be implemented.

In particular, a heat conversion device of which power is uniformly generated using fins and the power generation performance is improved, and a power generation system including the same can be provided.

Various useful advantages and effects of the present invention are not limited to the above-described content and will be more easily understood while specific embodiments of the invention are described.

DESCRIPTION OF DRAWINGS

FIG. 3 is a perspective view illustrating a first frame in the heat conversion device according to the embodiment of the present invention.

FIG. 24 is a block diagram illustrating a power generation system according to an embodiment of the present invention.

MODES OF THE INVENTION

Figure 1:
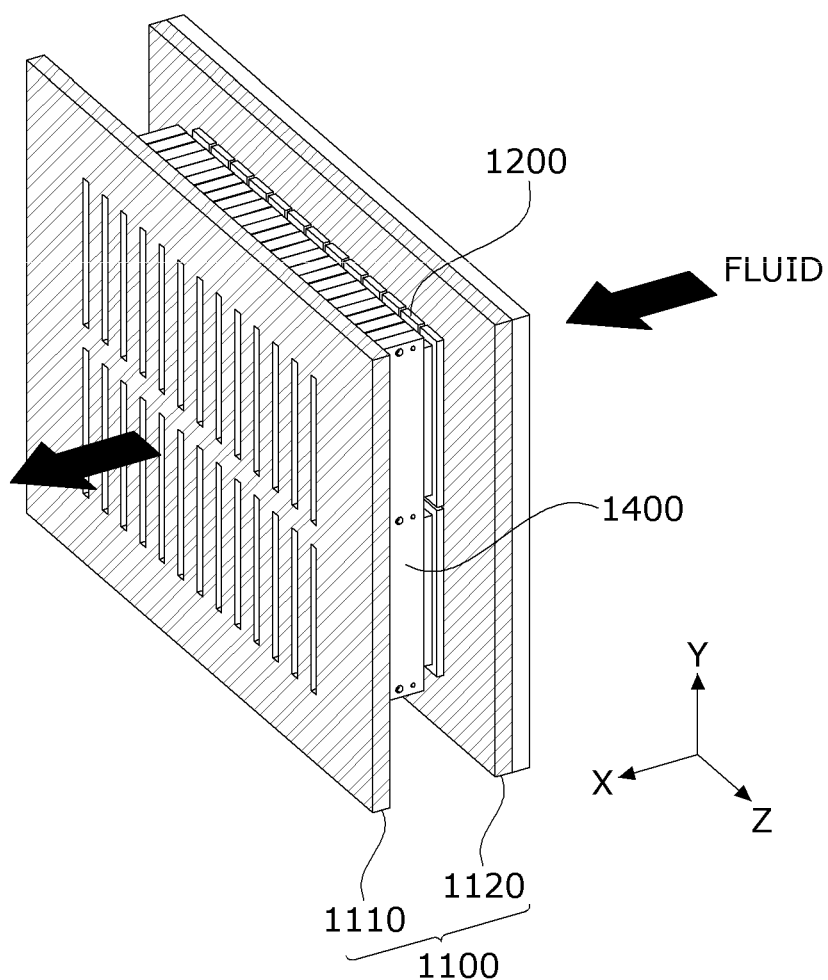
FIG. 1 is a perspective view illustrating a heat conversion device according to an embodiment of the present invention.

Hereinafter, exemplary embodiments of the present invention will be described in detail with reference to the accompanying drawings.

However, the technical spirit of the present invention is not limited to some embodiments which will be described and may be implemented using various other embodiments, and at least one component of the embodiments may be selectively coupled, substituted, and used within the range of the technical spirit of the present invention.

In addition, unless clearly and specifically defined otherwise by context, all terms (including technical and scientific terms) used herein may be interpreted as having meanings customarily understood by those skilled in the art, and meanings of generally used terms, such as those defined in commonly used dictionaries, will be interpreted by considering contextual meanings of the related technology.

In addition, terms used in the embodiments of the present invention are considered in a descriptive sense and not for limiting the present invention.

In the present specification, unless specifically indicated otherwise by the context, singular forms may include the plural forms thereof, and in a case in which "at least one (or one or more) among A, B, and C" is described, this may include at least one combination among all possible combinations of A, B, and C.

In addition, in descriptions of components of the present invention, terms such as "first," "second," "A," "B," "(a)," and "(b)" may be used.

The terms are only to distinguish one element from another element, and an essence, order, and the like of the element are not limited by the terms.

In addition, when an element is referred to as being "connected" or "coupled" to another element, such a description may include not only a case in which the element is directly connected or coupled to another element but also a case in which the element is connected or coupled to another element with still another element disposed therebetween.

In addition, in a case in which any one element is described as being formed or disposed "on" or "under" another element, such a description includes not only a case in which the two elements are formed or disposed in direct contact with each other but also a case in which one or more other elements are formed or disposed between the two elements. In addition, when one element is described as being disposed "on or under" another element, such a description may include a case in which the one element is disposed at an upper side or lower side with respect to another element.

First, a thermoelectric apparatus (or power generation apparatus) of the present invention may be used in a power generation system including a thermoelectric element or a thermoelectric module. For example, a power generation apparatus (which is a thermoelectric apparatus and includes a thermoelectric module or a thermoelectric element) may be connected to or include a path or tube through which a fluid flows. In addition, the power generation apparatus may be variously applied according to a difference in temperature between a low-temperature part and a high-temperature part of the thermoelectric element.

Figure 2:
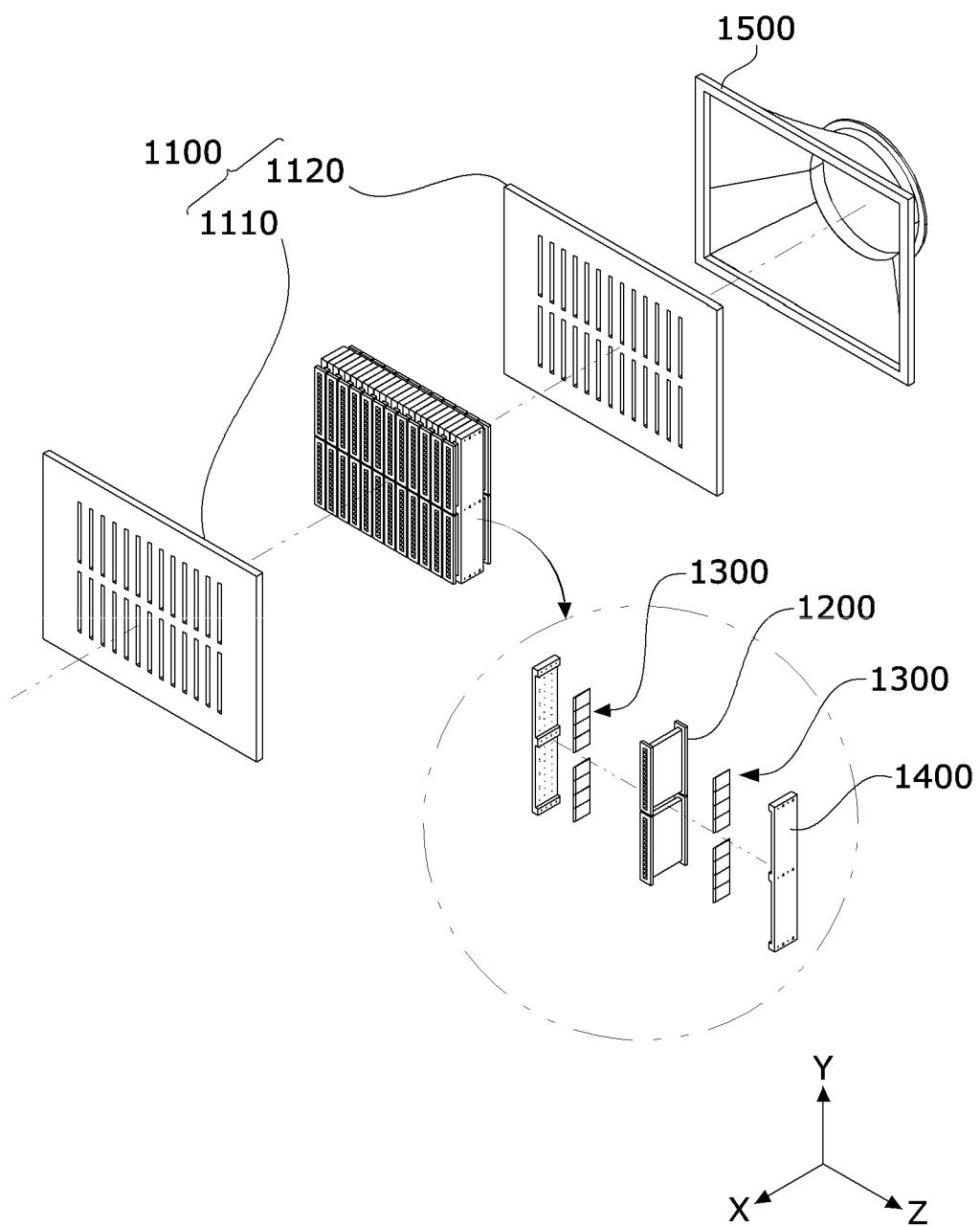
FIG. 2 is an exploded perspective view illustrating the heat conversion device according to the embodiment of the present invention.

FIG. 1 is a perspective view illustrating a heat conversion device according to an embodiment of the present invention, and FIG. 2 is an exploded perspective view illustrating the heat conversion device according to the embodiment of the present invention.

Referring to FIGS. 1 and 2, a heat conversion device 1000 according to the embodiment of the present invention may include frames 1100, fluid flow parts 1200, thermoelectric elements 1300, jackets 1400, and a guide part 1500.

In the heat conversion device 1000 according to the embodiment, a fluid (for example, steam) may flow through a first through hole in each of the fluid flow parts 1200 in a first direction (X-axis direction). While the fluid flows in the first direction (X-axis direction), heat may be transferred to the fluid flow part 1200, and the thermoelectric element 1300 in contact with the fluid flow part 1200 may perform power generation using the transferred heat.

More specifically, each of the frames 1100 may be in contact with the fluid flow parts 1200. The frame 1100 may be in contact with a first surface or a second surface of each of the fluid flow part 1200 and include a second through hole extending in the first direction (X-axis direction). The fluid may pass through the second through hole.

In addition, one frame 1100 or a plurality of frames 1100 may be provided. In the embodiment, the frames 1100 may include a first frame 1110 disposed at one side of the fluid flow part 1200 and a second frame 1120 disposed at the other side of the fluid flow part 1200. For example, the first frame 1110 may be in contact with the first surface of the fluid flow part 1200, and the second frame 1120 may be in contact with the second surface of the fluid flow part 1200.

In addition, the first frame 1110 and the second frame 1120 may be disposed to be spaced apart from each other in the first direction (X-axis direction). In addition, in the present specification, a fluid may pass through the first frame 1110 after passing through the second frame 1120. Alternatively, the first frame 1110 and the second frame 1120 may be sequentially disposed in parallel in the first direction (the X-axis direction) from the second frame 1120 to the first frame 1110. In this case, the first direction (X-axis direction) may correspond to a direction from the second frame toward the first frame spaced apart from the second frame and may be the same as a direction in which the fluid flows. In addition, in the drawings, a second direction (Y-axis direction) may be a direction perpendicular to the first direction (X-axis direction), and a third direction (Z-axis direction) may be a direction perpendicular to the first direction and the second direction. The second direction (Y-axis direction) corresponds to an extension direction of a long side of a cross section (YZ) of the second through hole in the first frame and the second frame. In addition, the third direction (Z-axis direction) may correspond to a direction from the fluid flow part 1200 toward adjacent thermoelectric elements symmetrically disposed with respect to the second through hole.

The fluid flow part 1200 may be disposed between the adjacent frames. In the embodiment, the fluid flow part 1200 may be positioned between the first frame 1110 and the second frame 1120. In addition, the fluid flow part 1200 may be in contact with the first frame 1110 and the second frame 1120.

The fluid flow part 1200 may include the first through hole extending in the first direction (the X-axis direction). In addition, the fluid flow part 1200 may include the first surface and the second surface disposed in the first direction (X-axis direction). In addition, the first through hole may pass through the first surface and the second surface of the fluid flow part 1200.

In addition, the fluid flow part 1200 may include at least one fin disposed in the first through hole to form a plurality of sub through holes. The at least one fin may extend in the first direction (X-axis direction) and be in contact with a side surface of the first through hole.

One thermoelectric element 1300 or a plurality of thermoelectric elements 1300 may be provided. In the embodiment, the thermoelectric element 1300 may be disposed on a side surface of the fluid flow part 1200. For example, the plurality of thermoelectric elements 1300 may be symmetrically positioned with respect to the fluid flow part 1200. Accordingly, the thermoelectric elements 1300 may partially overlap in the third direction (the Z-axis direction). According to such a structure, heat of a fluid may be uniformly provided to the thermoelectric elements overlapping in the third direction. Accordingly, a difference in temperature between an upper substrate and a lower substrate in the thermoelectric element may be uniform, and thus power generation performance of the heat conversion device according to the embodiment can be improved.

The thermoelectric element 1300 may include a first substrate in contact with one surface of the fluid flow part 1200, a second substrate disposed to be spaced apart from the first substrate, first electrodes disposed on the first substrate, second electrodes disposed under the second substrate, and a plurality of thermoelectric legs disposed between the first electrodes and second electrodes. In this case, the first substrate may be a low-temperature part and the second substrate may be a high-temperature part. This will be described below.

Each of the jackets 1400 may be disposed on the side surface of the fluid flow part 1200. In addition, the jacket 1400 may also be disposed to surround at least a part of the fluid flow part 1200 from the outside of the fluid flow part 1200.

In addition, the jacket 1400 may be in contact with the thermoelectric element 1300. A groove may be formed in the jacket 1400. The thermoelectric element 1300 may be seated in the groove. For example, the groove may be in contact with the first substrate of the thermoelectric element 1300. In addition, a plurality of fastening holes or fastening grooves may be formed in the first substrate, and the first substrate and the jacket 1400 may be coupled to each other using the fastening holes or fastening grooves. In this specification, the term "fastening groove" may also be referred to as "groove," "coupling groove," or the like.

In addition, a temperature of a fluid (second fluid) positioned in the jacket 1400 may be lower than a temperature of the fluid (first fluid) passing through the first through hole or the fluid flow part 1200. Alternatively, a temperature of a first fluid may be higher than a temperature of a second fluid. For example, the first fluid may be steam, and the second fluid may be cooling water.

The guide part 1500 may be a member through which a fluid is introduced from the outside. The guide part 1500 may be disposed at one side of the second frame 1120. In addition, an area of an inlet of the guide part 1500 may be equal to or different from an area of an outlet of the guide part 1500. For example, when the area of the inlet and the area of the outlet of the guide part 1500 are adjusted, a temperature of the fluid passing through the heat conversion device 1000 may have a predetermined temperature (for example, a desired temperature). In addition, the fluid may be output from the heat conversion device 1000 at a desired flow rate.

Figure 4:
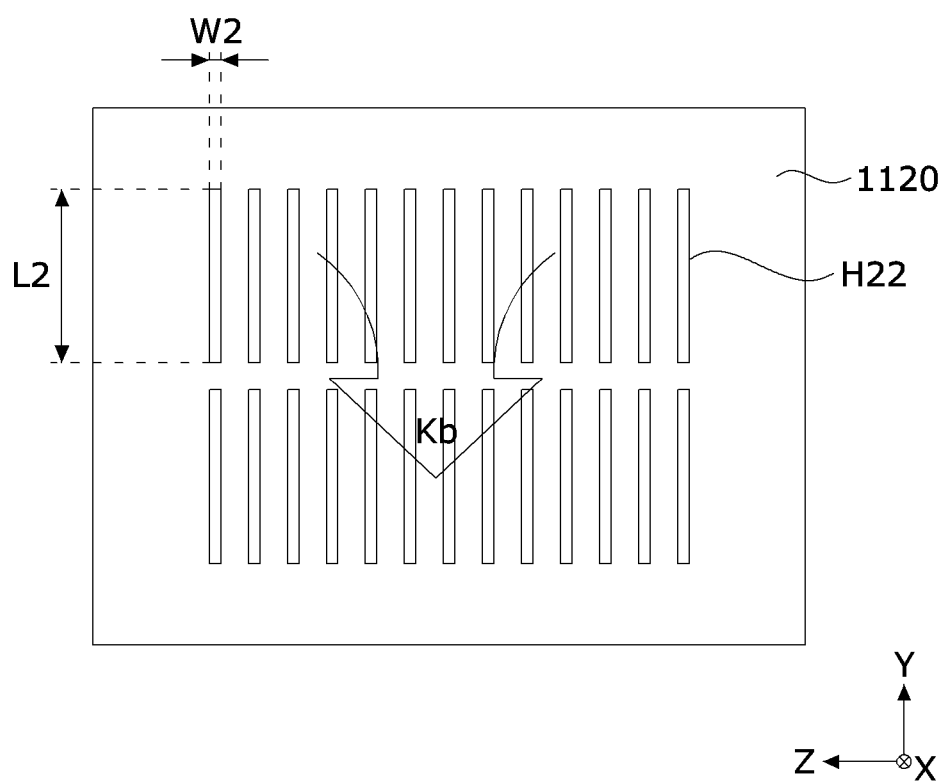
FIG. 4 is a perspective view illustrating a second frame in the heat conversion device according to the embodiment of the present invention.
Figure 5:
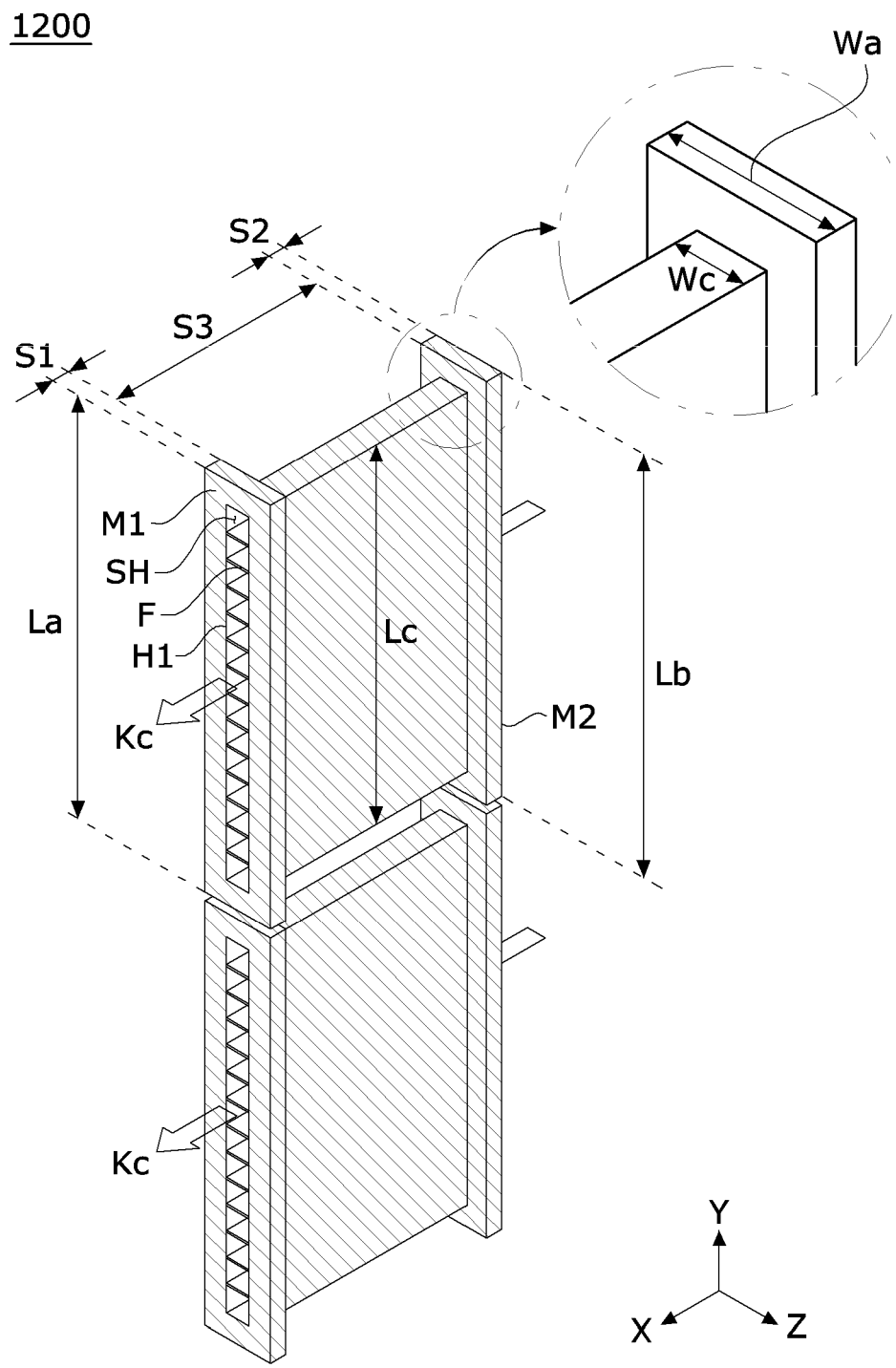
FIG. 5 is a perspective view illustrating a fluid flow part in the heat conversion device according to the embodiment of the present invention.

FIG. 3 is a perspective view illustrating the first frame in the heat conversion device according to the embodiment of the present invention, FIG. 4 is a perspective view illustrating the second frame in the heat conversion device according to the embodiment of the present invention, and FIG. 5 is a perspective view illustrating the fluid flow part in the heat conversion device according to the embodiment of the present invention.

Referring to FIGS. 3 to 5, the frames according to the embodiment may include the first frame 1110 and the second frame 1120 as described above. In addition, the fluid flow part 1200 may include a second surface M2 and a first surface M1. The second surface M2 and the first surface M1 may be disposed to be spaced apart from each other in the first direction (X-axis direction). A fluid may pass through the second surface M2 and then pass through the first surface M1. That is, the first surface M1 may be positioned at a side in the first direction (X-axis direction) from the second surface M2, and the second surface M2 and the first surface M1 may be sequentially disposed in parallel in the first direction (X-axis direction).

The first frame 1110 may be in contact with the first surface M1, and the second frame 1120 may be in contact with the second surface M2. In addition, the frame may include the second through hole. In the embodiment, the first frame 1110 may include a 2-1 through hole H21, and the second frame 1120 may include a 2-2 through hole H22. Alternatively, second through holes H2 may include the 2-1 through hole H21 and the 2-2 through hole H22. The first frame 1110 and the second frame 1120 may be disposed to be spaced apart from each other, and various members may be disposed between the first frame 1110 and the second frame 1120 as described below.

In addition, a fluid may be output in the first direction Ka (X-axis direction) through the 2-1 through hole H21. In addition, a fluid may be output in the first direction Kb (X-axis direction) through the 2-2 through hole H22.

A width W1 of the 2-1 through hole H21 in the third direction (Z-axis direction) may be equal to or different from a width W2 of the 2-2 through hole H22 in the third direction (Z-axis direction). In the present specification, the term "width" is a length in the third direction (Z-axis direction). In addition, the term "height" may be a length in the second direction (Y-axis direction).

In addition, a length L1 of the 2-1 through hole H21 in the second direction (Y-axis direction) may be equal to or different from a length L2 of the 2-2 through hole H22 in the second direction (Y-axis direction).

In the embodiment, the length of each of the second through holes H2 in a direction perpendicular to the first direction may be greater than or equal to a length of a first through hole H1 in the direction perpendicular to the first direction.

For example, the width of the second through hole H2 in the third direction (Z-axis direction) may be greater than or equal to a width of the first through hole H1 in the third direction (Z-axis direction). In addition, the length of the second through hole H2 in the second direction (Y-axis direction) may be greater than or equal to the length of the first through hole H1 in the second direction (Y-axis direction). According to such a structure, a phenomenon in which a fluid comes into contact with the frame and flows backward due to a clash with the frame while flowing in the first direction can be inhibited. In addition, the fluid may not flow between the fluid flow part and the frame due to a generated differential pressure. Accordingly, the heat conversion device according to the embodiment can be free from moisture of the fluid, and thus reliability can be improved.

For example, the length of the 2-1 through hole H21 in the direction perpendicular to the first direction may be equal to the length of the 2-2 through hole H22 in the direction perpendicular to the first direction. Accordingly, a fluid may flow into and out of the heat conversion device at a uniform flow rate. Accordingly, the generation of a differential pressure in the heat conversion device can be inhibited.

Alternatively, the length of the 2-1 through hole H21 in the direction perpendicular to the first direction may be different from the length of the 2-2 through hole H22 in the direction perpendicular to the first direction. For example, the length of the 2-1 through hole H21 in the direction perpendicular to the first direction may be greater than the length of the 2-2 through hole H22 in the direction perpendicular to the first direction. Accordingly, a flow of a fluid in a direction opposite to the first direction may be minimized while the fluid sequentially passes through the second frame 1120, the fluid flow part 1200, and the first frame 1110. Accordingly, in the heat conversion device, a differential pressure decreases, and even when a sealing member or the like is disposed between the frame 1100 and the fluid flow part 1200, a phenomenon in which a fluid flows into the inside (for example, a side of the thermoelectric element) can be easily inhibited.

The fluid flow part 1200 may include the first through hole H1 extending in the first direction (X-axis direction) and passing through the first surface M1 and the second surface M2. In addition, the fluid flow part 1200 or the heat conversion device may further include fins F. The first through hole H1 may be divided into a plurality of sub through holes SH by the fin F. That is, the first through hole H1 may include the plurality of sub through holes SH.

In the sub through holes SH divided by at least one fin F, the number of sub through holes SH in the first surface M1 may be equal to the number of sub through holes SH in the second surface M2.

In addition, the fluid flow part 1200 according to the embodiment may include a first region S1 and a second region S2 which are spaced apart from each other in the first direction (X-axis direction) and a third region S3 disposed between the first region S1 and the second region S2. The second region S2 may include the second surface M2, and the first region S1 may include the first surface M1. The first region S1 may be positioned at a side in the first direction (X-axis direction) along the second region S2. A fluid may flow in the first through hole H1 in the order from the second region S2, the third region S3, and the first region S1 (Kc).

Lengths La and Lb of the first region S1 and the second region S2 in the second direction (Y-axis direction) may be greater than a length Lc of the third region S3 in the second direction (Y-axis direction). In addition, lengths Wa and Wb of the first region S1 and the second region S2 in the third direction (Z-axis direction) may be greater than a length We of the third region S3 in the third direction (Z-axis direction). In addition, the first region S1 and the second region S2 may overlap the thermoelectric element in the first direction (X-axis direction). According to such a structure, a region in which the thermoelectric element is seated may be in the third region S3. In addition, the jacket may also be positioned in the third region. Accordingly, even when the thermoelectric element and the jacket are disposed on the side surface of the fluid flow part 1200, the heat conversion device can be easily miniaturized.

The third region S3 may overlap at least one thermoelectric element and the jacket in the third direction (Z-axis direction). In addition, at least a part of the jacket 1400 may overlap the first region S1 and the second region S2 in the first direction (X-axis direction).

Figure 6:
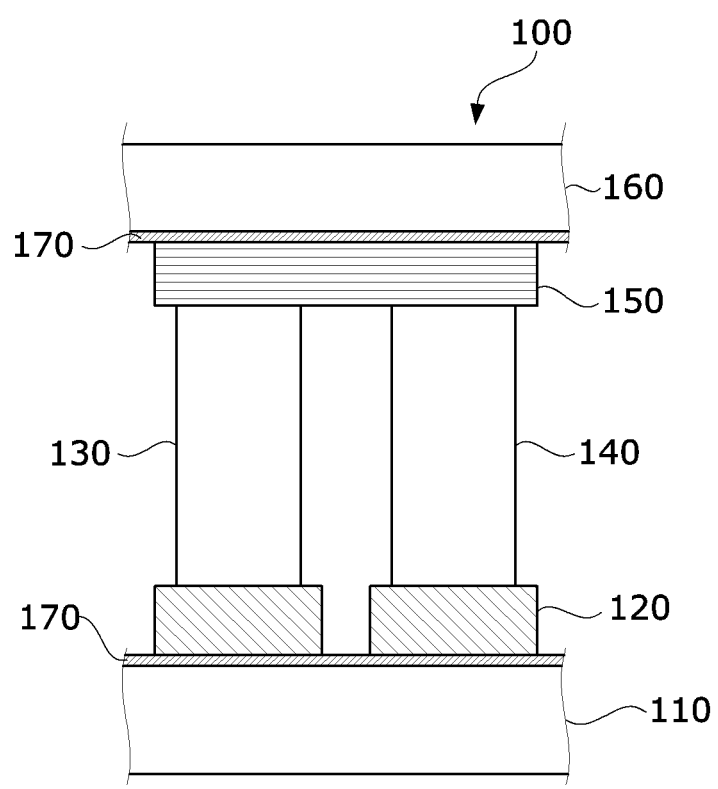
FIGS. 6 and 7 are views illustrating a thermoelectric element according to the embodiment of the present invention.
Figure 7:
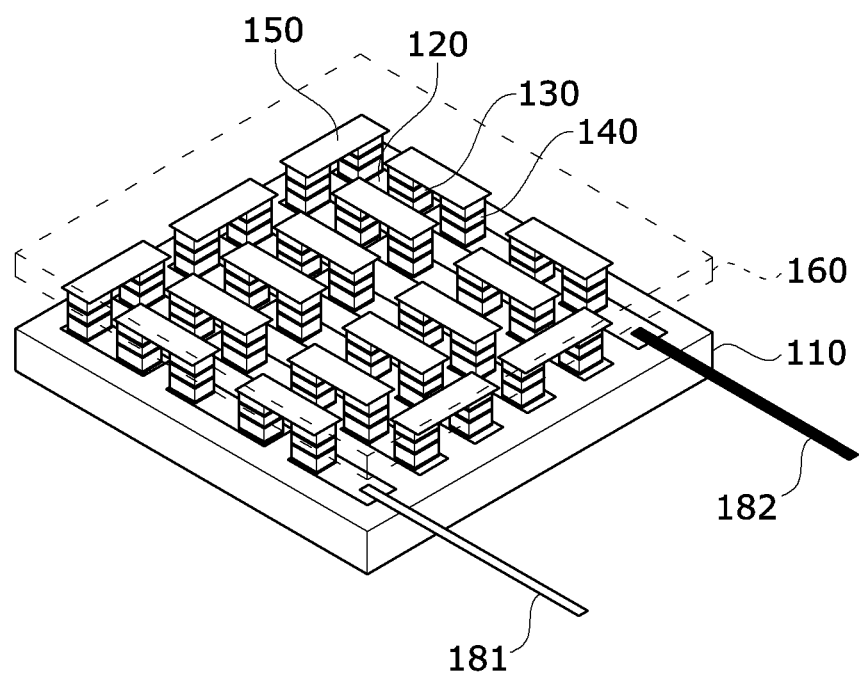

FIGS. 6 and 7 are views illustrating the thermoelectric element according to the embodiment of the present invention.

Referring to FIGS. 6 and 7, a thermoelectric element 100 includes a first substrate 110, first electrodes 120, P-type thermoelectric legs 130, N-type thermoelectric legs 140, second electrodes 150, and a second substrate 160. In this case, the thermoelectric element 100 may correspond to the thermoelectric element 1300 (see FIG. 2), and a description below may be equally applied to the above-described thermoelectric element. Accordingly, the first substrate 110 may be in contact with the jacket and the second substrate 160 may be in contact with the third region of the side surface of the fluid flow part.

The first electrodes 120 are disposed between the first substrate 110 and lower surfaces of the P-type thermoelectric legs 130 and the N-type thermoelectric legs 140, and the second electrodes 150 are disposed between the second substrate 160 and upper surfaces of the P-type thermoelectric legs 130 and the N-type thermoelectric legs 140. Accordingly, the plurality of P-type thermoelectric legs 130 and the plurality of N-type thermoelectric legs 140 are electrically connected through the first electrodes 120 and the second electrodes 150. A pair of P-type thermoelectric leg 130 and N-type thermoelectric leg 140 disposed between and electrically connected to the first electrodes 120 and the second electrode 150 may form a unit cell.

For example, when a voltage is applied to the first electrode 120 and the second electrode 150 through lead wires 181 and 182, due to the Peltier effect, the substrate through which a current flows from the P-type thermoelectric leg 130 to the N-type thermoelectric leg 140 may absorb heat and serve as a cooling part, and the substrate through which a current flows from the N-type thermoelectric leg 140 to the P-type thermoelectric leg 130 may be heated and serve as a heating part. Alternatively, when a difference in temperature is applied between the first electrode 120 and the second electrode 150, due to the Seebeck effect, charges in the P-type thermoelectric leg 130 and the N-type thermoelectric leg 140 may also be moved to generate electricity. In the present specification, charges may be moved in the P-type thermoelectric leg 130 and the N-type thermoelectric leg 140 to generate electricity.

In this case, each of the P-type thermoelectric leg 130 and the N-type thermoelectric leg 140 may be a bismuth-telluride (Bi—Te)-based thermoelectric leg mainly including Bi and Te. The P-type thermoelectric leg 130 may be a Bi—Te-based thermoelectric leg including at least one among antimony (Sb), nickel (Ni), aluminum (Al), copper (Cu), silver (Ag), lead (Pb), boron (B), gallium (Ga), Te, Bi, and indium (In). As an example, the P-type thermoelectric leg 130 may include Bi—Sb—Te at 99 to 99.999 wt % as a main material and at least one material among Ni, Al, Cu, Ag, Pb, B, Ga, and In at 0.001 to 1 wt % based on a total weight of 100 wt %. The N-type thermoelectric leg 140 may be a Bi—Te-based thermoelectric leg including at least one among Se, Ni, Al, Cu, Ag, Pb, B, Ga, Te, Bi, and In. As an example, the N-type thermoelectric leg 140 may include Bi—Se—Te at 99 to 99.999 wt % as a main material and at least one material among Ni, Al, Cu, Ag, Pb, B, Ga, and In at 0.001 to 1 wt % based on a total weight of 100 wt %.

Each of the P-type thermoelectric leg 130 and the N-type thermoelectric leg 140 may be formed in a bulk type or stack type. Generally, the bulk type P-type thermoelectric leg 130 or the bulk type N-type thermoelectric leg 140 may be formed through a process in which a thermoelectric material is thermally processed to manufacture an ingot, the ingot is ground and strained to obtain a powder for a thermoelectric leg, the powder is sintered, and the sintered powder is cut. In this case, each of the P-type thermoelectric leg 130 and the N-type thermoelectric leg 140 may be a polycrystalline thermoelectric leg. As described above, when each of the P-type thermoelectric leg 130 and the N-type thermoelectric leg 140 is the polycrystalline thermoelectric leg, the strength of each of the P-type thermoelectric leg 130 and the N-type thermoelectric leg 140 may increase. The stacked P-type thermoelectric leg 130 or the stacked N-type thermoelectric leg 140 may be formed in a process in which a paste containing a thermoelectric material is applied on base members each having a sheet shape to form unit members, and the unit members are stacked and cut.

In this case, the P-type thermoelectric leg 130 and the N-type thermoelectric leg 140 provided in a pair may have the same shape and volume or may have different shapes and volumes. For example, since electrical conduction characteristics of the P-type thermoelectric leg 130 and the N-type thermoelectric leg 140 are different, a height or cross-sectional area of the N-type thermoelectric leg 140 may also be different from that of the P-type thermoelectric leg 130.

In this case, the P-type thermoelectric leg 130 or the N-type thermoelectric leg 140 may have a cylindrical shape, a polygonal column shape, an elliptical column shape, or the like.

In the present specification, the thermoelectric leg may also be referred to as a thermoelectric structure, a semiconductor element, a semiconductor structure, and the like.

The performance of a thermoelectric element according to one embodiment of the present invention may be expressed as a thermoelectric performance figure of merit (ZT). The thermoelectric performance figure of merit (ZT) may be expressed by Equation 1.

$$ZT=\alpha^2 \cdot \sigma \cdot T/k \quad \text{[Equation 1]}$$

In this case, a denotes the Seebeck coefficient [V/K], G denotes electrical conductivity [S/m], and $\alpha^2 \cdot \sigma$ denotes a power factor [W/mK$^2$]. In addition, T denotes temperature, and k denotes thermal conductivity [W/mK]. k may be expressed as a·cp·p, wherein a denotes thermal diffusivity [cm2/S], cp denotes specific heat [J/gK], and ρ denotes density [g/cm$^3$].

In order to obtain the thermoelectric performance figure of merit (ZT) of a thermoelectric element, a Z value (V/K) is measured using a Z value, and the thermoelectric performance figure of merit (ZT) may be calculated using the measured Z value.

In this case, each of the first electrodes 120 disposed between the first substrate 110 and the P-type thermoelectric legs 130 and the N-type thermoelectric legs 140 and the second electrodes 150 disposed between the second substrate 160 and the P-type thermoelectric legs 130 and the N-type thermoelectric legs 140 may include at least one among Cu, Ag, Al, and Ni and may have a thickness of 0.01 mm to 0.3 mm. When the thickness of the first electrode 120 or the second electrode 150 is smaller than 0.01 mm, an electrode function is degraded, and thus the electrical conductivity performance may be degraded, and when the thickness is greater than 0.3 mm, a resistance increases, and thus a conduction efficiency can be lowered.

In addition, each of the first substrate 110 and the second substrate 160, which are opposite to each other, may be a metal substrate, and a thickness of the first substrate 110 and the second substrate 160 may be in the range of 0.1 mm to 1.5 mm. When the thickness of the metal substrate is smaller than 0.1 mm or greater than 1.5 mm, since a heat radiation characteristic or thermal conductivity may become excessively high, the reliability of the thermoelectric element may be degraded. In addition, when each of the first substrate 110 and the second substrate 160 is the metal substrate, insulation layers 170 may be further formed between the first substrate 110 and the first electrodes 120 and between the second substrate 160 and the second electrodes 150. Each of the insulation layers 170 may include a material having a thermal conductivity of 1 to 20 W/mK. In this case, the insulation layer 170 may be a resin composition including at least one of epoxy resin and silicone resin and an inorganic material, a layer formed of a silicon composite including silicon and an inorganic material, or an aluminum oxide layer. In this case, the inorganic material may be at least one among an oxide, a carbide, and a nitride combined with aluminum, boron, silicon, or the like.

In this case, sizes of the first substrate 110 and the second substrate 160 may also be different. That is, a volume, a thickness, or an area of one of the first substrate 110 and the second substrate 160 may be greater than a volume, a thickness, or an area of the other. In this case, the thickness may be a thickness in a direction from the first substrate 110 toward the second substrate 160, and the area may be an area in a direction perpendicular to the direction from the first substrate 110 toward the second substrate 160. Accordingly, the heat absorption or radiation performance of the thermoelectric element can be improved. Preferably, at least one of the volume, the thickness, and the area of the first substrate 110 may be formed greater than that of the second substrate 160. In this case, when the first substrate 110 is disposed in a high-temperature region for the Seebeck effect or applied as a heating region for the Peltier effect, or a sealing member or the like for protecting the thermoelectric element, which will be described below, from an external environment is disposed on the first substrate 110, at least one of the volume, the thickness, and the area of the first substrate 110 may be formed greater than that of the second substrate 160. In this case, the area of the first substrate 110 may be formed in the range of 1.2 to 5 times the area of the second substrate 160. When the area of the first substrate 110 is smaller than 1.2 times the area of the second substrate 160, an effect of an increase in heat transfer efficiency may not be large, and when the area of the first substrate 110 is greater than 5 times the area of the second substrate 160, a heat transfer efficiency may rather be remarkably reduced, and it can be difficult to maintain a basic shape of the thermoelectric module.

In addition, a heat radiation pattern, for example, a concave-convex pattern, may be formed on a surface of at least one of the first substrate 110 and the second substrate 160. Accordingly, the heat radiation performance of the thermoelectric element can be improved. When the concave-convex pattern is formed on the surface in contact with the P-type thermoelectric legs 130 or the N-type thermoelectric legs 140, a bonding characteristic between the thermoelectric legs and the substrate can also be improved.

Although not illustrated in the drawings, the sealing member may be further disposed between the first substrate 110 and the second substrate 160. The sealing member may be disposed on side surfaces of the first electrodes 120, the P-type thermoelectric legs 130, the N-type thermoelectric legs 140, and the second electrodes 150 between the first substrate 110 and the second substrate 160. Accordingly, the first electrodes 120, the P-type thermoelectric legs 130, the N-type thermoelectric legs 140, and the second electrodes 150 can be sealed from external moisture, heat, contamination, and the like.

The description of the thermoelectric element 100 according to the embodiment may be applied to components of the thermoelectric module or the thermoelectric element of the thermoelectric apparatus according to the embodiment of the present invention. This will be described below.

Figure 8:
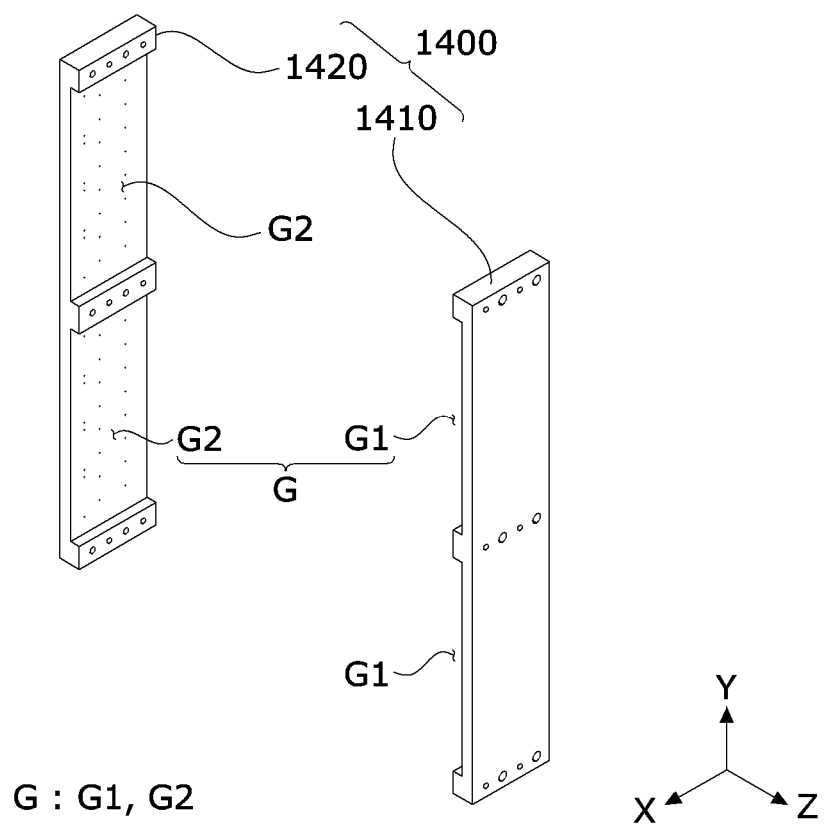
FIG. 8 is a perspective view illustrating a jacket in the heat conversion device according to the embodiment of the present invention.
Figure 9:
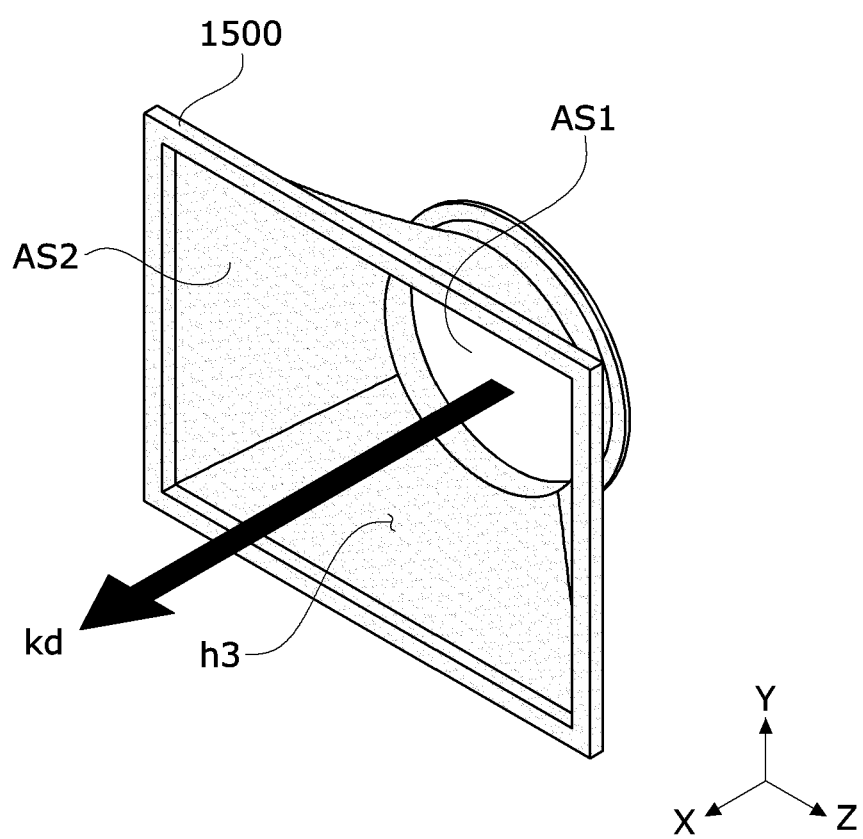
FIG. 9 is a perspective view illustrating a guide part in the heat conversion device according to the embodiment of the present invention.

FIG. 8 is a perspective view illustrating the jacket in the heat conversion device according to the embodiment of the present invention, and FIG. 9 is a perspective view illustrating the guide part in the heat conversion device according to the embodiment of the present invention.

Referring to FIG. 8, the heat conversion device may include one or more jackets. The jackets 1400 may include first jackets 1410 and second jackets 1420.

Each of the first jackets 1410 may be positioned at one side of the fluid flow part, and each of the second jackets 1420 may be positioned at the other side of the fluid flow part. The first jacket 1410 and the second jacket 1420 may be disposed to be spaced apart from each other in the third direction (Z-axis direction). In addition, each of the first jacket 1410 and the second jacket 1420 may include a seating groove in which the thermoelectric element is seated.

In the embodiment, the first jacket 1410 may include first seating grooves G1, and the second jacket 1420 may include second seating grooves G2. Each of the first seating grooves G1 and one of the second seating grooves G2 may overlap in the third direction (Z-axis direction) and may be symmetrically positioned with respect to the fluid flow part. At least one fastening groove or fastening hole may be disposed in each of the first seating groove G1 and the second seating groove G2. Accordingly, the first substrate of the thermoelectric element and the jacket can be coupled to each other as described above.

A fluid may be introduced through the guide part 1500 from the outside as described above. In addition, the guide part 1500 may be in contact with the second frame and may include a hole H3 so that the fluid introduced through the guide part 1500 flows to the second through hole of the second frame (kd). That is, the fluid flows along the hole H3, and in this case, the fluid may be a hot fluid, that is the first fluid.

In addition, in the guide part 1500, an area AS1 of the inlet may be different from an area AS2 of the outlet. For example, the area AS1 of the inlet may be smaller than the area AS2 of the outlet.

Figure 10:
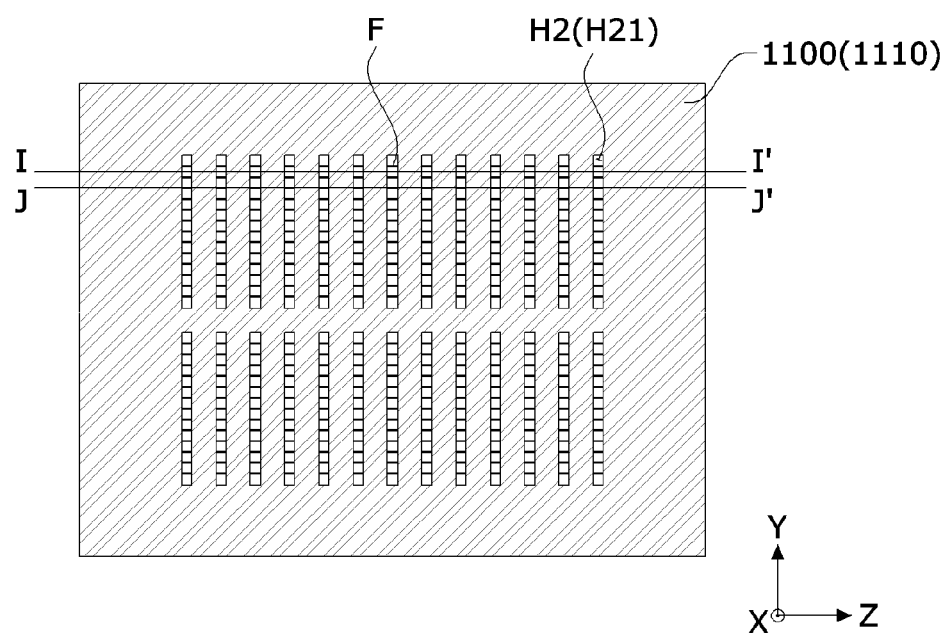
FIG. 10 is a side view illustrating the heat conversion device according to the embodiment of the present invention.
Figure 11:
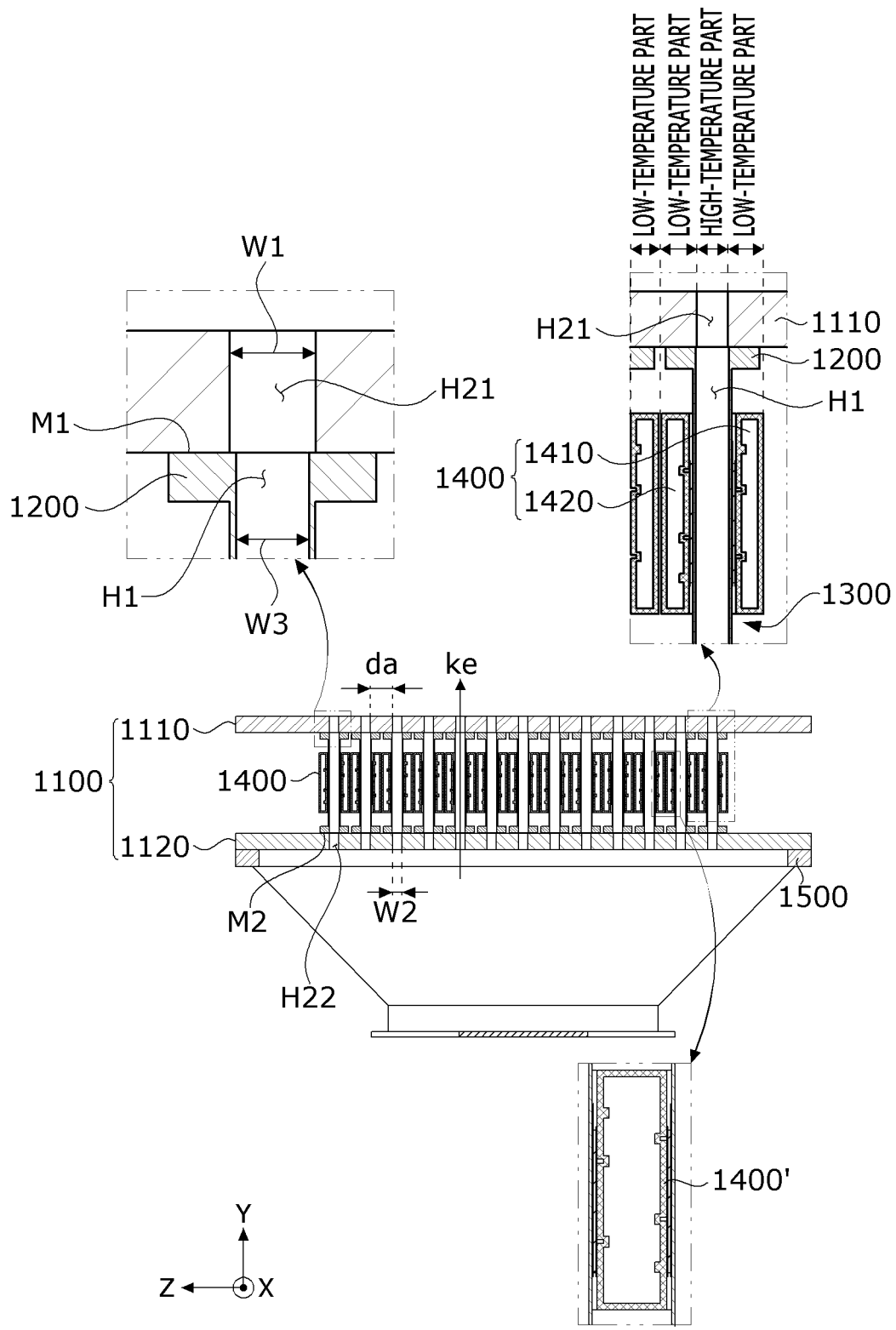
FIG. 11 is a cross-sectional view illustrating the heat conversion device along line II' in FIG. 10.
Figure 12:
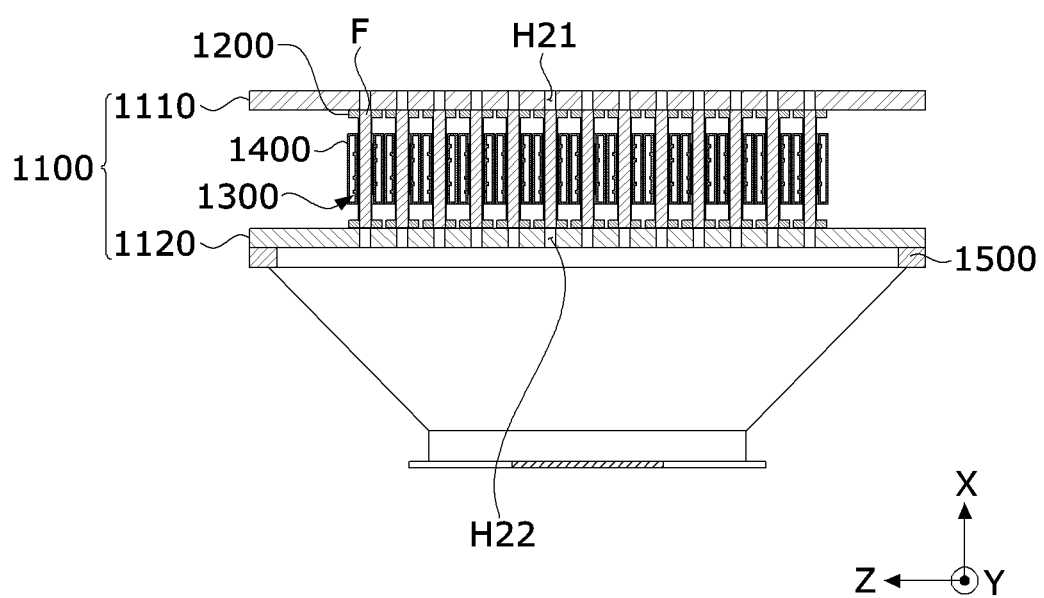
FIG. 12 is a cross-sectional view illustrating the heat conversion device along line JJ' in FIG. 10.
Figure 13:
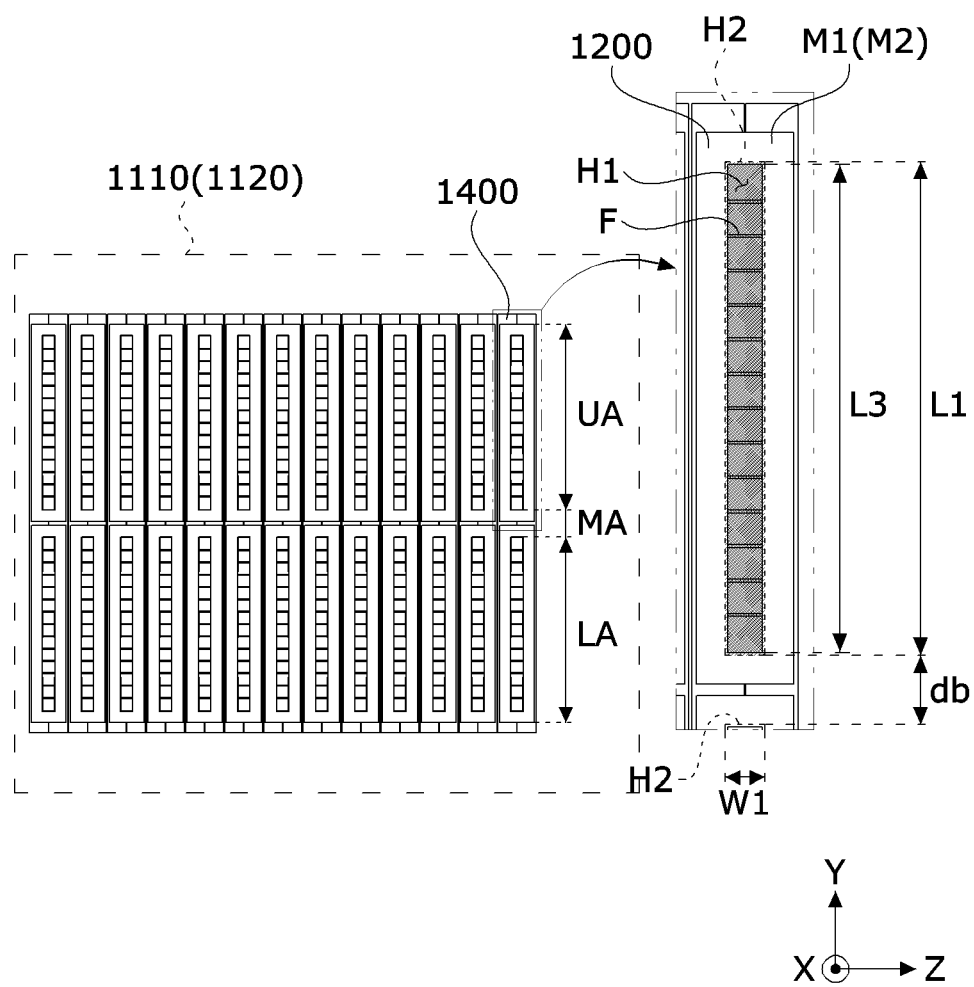
FIG. 13 is a view illustrating the inside of a frame in the heat conversion device according to the embodiment of the present invention.
Figure 14:
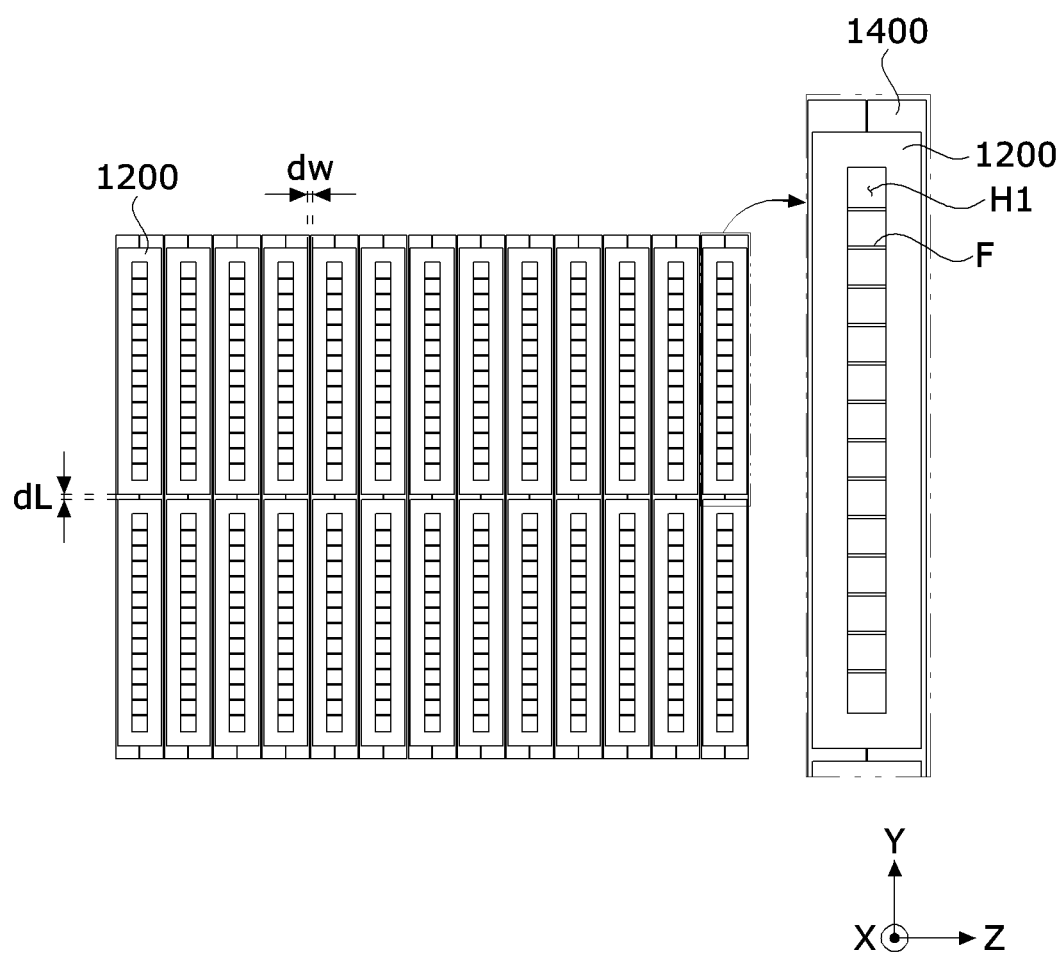
FIG. 14 is a view illustrating a state in which the frame is omitted in the heat conversion device according to the embodiment of the present invention.

FIG. 10 is a side view illustrating the heat conversion device according to the embodiment of the present invention, FIG. 11 is a cross-sectional view illustrating the heat conversion device along line II' in FIG. 10, and FIG. 12 is a cross-sectional view illustrating the heat conversion device along line JJ' in FIG. 10. FIG. 13 is a view illustrating the inside of the frame in the heat conversion device according to the embodiment of the present invention, and FIG. 14 is a view illustrating a state in which the frame is omitted in the heat conversion device according to the embodiment of the present invention.

Referring to FIGS. 10 to 14, a fluid may sequentially flow through the guide part 1500, the 2-2 through hole H22 of the second frame 1120, the first through hole H1 of the fluid flow part 1200, and the 2-1 through hole H21 of the first frame 1110 (in a direction of Ke).

In addition, in the embodiment, the lengths of the second through holes H21 and H22 in the direction perpendicular to the first direction (X-axis direction) may be smaller than or equal to a length of the first surface M1 or the second surface M2 in the direction perpendicular to the first direction (X-axis direction) and may be greater than or equal to the length of the first through hole H1 in the direction perpendicular to the first direction (X-axis direction).

For example, the width W1 of the 2-1 through hole H21 in the third direction (Z-axis direction) and the width W2 of the 2-2 through hole H22 in the third direction (Z-axis direction) may be smaller than or equal to the width Wa or Wb (see FIG. 5) of the first surface M1 or the second surface M2 in the third direction (Z-axis direction). In addition, the width W1 of the 2-1 through hole H21 in the third direction (Z-axis direction) and the width W2 of the 2-2 through hole H22 in the third direction (Z-axis direction) may be greater than or equal to a width W3 of the first through hole H1 in the third direction (Z-axis direction).

According to such a structure, a phenomenon in which a fluid comes into contact with the frame and flows backward while flowing in the first direction can be inhibited. In addition, the fluid may not flow between the fluid flow part and the frame due to a generated differential pressure. Accordingly, the heat conversion device according to the embodiment can be free from moisture of the fluid, and thus reliability can be improved.

In addition, the second through hole H2 may be spaced apart from the adjacent second through hole in the third direction or the second direction (perpendicular to the first direction). In the embodiment, the width W1 of each of the plurality of second through holes H2 may be smaller than a width da between the through holes H2 which are closest to each other among the plurality of second through holes H2. In other words, the width W1 of the second through hole H2 in the third direction (Z-axis direction) may be smaller than the length da between the second through holes H2 close to each other in the third direction (Z-axis direction). According to such a structure, the heat exchange of the heat conversion device according to the embodiment can be improved. In addition, an increase in differential pressure on the first fluid flowing into the heat conversion device can be inhibited due to the plurality of second through holes H2. As the width of the second through hole H2 and the width between the adjacent second through holes H2 are kept small, a differential pressure on the first fluid introduced through the second through hole H2 may be maintained. Accordingly, an increase or decrease in differential pressure can be inhibited. Accordingly, a problem that a flow of the first fluid is changed according to a change in differential pressure, and thus the first fluid passes through an empty space and does not flow into the fluid flow part, the thermoelectric element, or the jacket can be inhibited. Accordingly, the power generation performance of the heat conversion device according to the embodiment can be improved, and reliability thereof can also be improved.

In addition, widths of the first jacket 1410 and the second jacket 1420 disposed between the adjacent fluid flow parts in the third direction (Z-axis direction) may increase. Accordingly, a high temperature can be transferred through the fluid flow part 1200, and a low temperature can be easily transferred through the jackets 1400 disposed between the adjacent fluid flow parts 1200.

In addition, the first jacket 1410 and the second jacket 1420 may be separated from each other or integrally formed between the adjacent fluid flow parts 1200 as described above. For example, in a case in which the first jacket 1410 and the second jacket 1420 are separated in the jackets 1400, when a failure occurs, only the failed jacket can be easily replaced.

In addition, an integrated type jacket 1400' may be disposed between adjacent fluid flow parts 1200. In this case, an amount or volume of a second fluid, which is cooling water, may increase between the adjacent fluid flow parts 1200. Accordingly, providing of a low temperature through the jacket 1400' can be improved, and thus the power generation performance can be improved.

In addition, a total area (ZY plane) of the plurality of second through holes H2 may be greater than or equal to a cross-sectional area of a tube, a pipe, or the like through which the first fluid flows into the heat conversion device. Accordingly, the generation of a differential pressure on the first fluid flowing into the heat conversion device can be inhibited. In addition, the length L1 of the 2-1 through hole H21 in the second direction (Y-axis direction) and the length L2 of the 2-2 through hole H22 in the second direction (Y-axis direction) may be smaller than or equal to the length La or Lb (see FIG. 5) of the first surface M1 or the second surface M2 in the second direction (Y-axis direction). In addition, the length L1 of the 2-1 through hole H21 in the second direction (Y-axis direction) and the length L2 of the 2-2 through hole H22 in the second direction (Y-axis direction) may be smaller than or equal to a length L3 of the first through hole H1 in the second direction (Y-axis direction). Accordingly, a phenomenon in which a fluid comes into contact with the frame and flows backward while flowing in the first direction can be inhibited. In addition, the fluid may not flow between the fluid flow part and the frame due to a generated differential pressure. Accordingly, the heat conversion device according to the embodiment can be free from moisture of the fluid, and thus reliability can be improved.

In addition, the second through hole H2 may be disposed to be spaced apart from the adjacent second through hole in the second direction (Y-axis direction). In the embodiment, the width W1 of the second through hole H2 in the third direction (Z-axis direction) may be smaller than a length db between the adjacent second through holes H2 in the second direction (Y-axis direction). According to such a structure, heat exchange through the jacket and the fluid flow part may be balanced in the heat conversion device according to the embodiment as a whole.

Specifically, the first surface (or the second surface) may be divided into a middle area MA between the adjacent second through holes H2 in the second direction (Y-axis direction), an upper area UA above the middle area MA, and a lower area LA below the middle area MA. The upper area UA, the middle area MA, and the lower area LA may be disposed side by side in the second direction (Y-axis direction).

In addition, as described above, the width W1 of the second through hole H2 in the third direction (Z-axis direction) is smaller than the length db between the adjacent second through holes H2 in the second direction (Y-axis direction). Accordingly, in the middle area MA, the first jacket 1410 and the second jacket 1420 may be pressed against the fluid flow part 1200 positioned between the first jacket 1410 and the second jacket 1420. Accordingly, the thermoelectric elements disposed in the upper area UA and the thermoelectric elements disposed in the lower area may be pressed by the fluid flow parts 1200 in uniform contact with the thermoelectric elements on the plane XY. Accordingly, heat exchange through the fluid flow part 1200 and the jacket 1400 may be uniformly performed as a whole without being concentrated in a particular area.

In addition, the plurality of jackets may be disposed to be spaced apart from each other by a predetermined distance dw in the third direction (Z-axis direction). The plurality of jackets may be disposed to be spaced apart from each other by a predetermined distance dL in the first direction (X-axis direction). In addition, the jackets 1400 may be in contact with the low-temperature parts, such as the first substrates of the thermoelectric elements 1300. In addition, the plurality of thermoelectric elements 1300 overlap in the third direction, and in the plurality of thermoelectric elements 1300, the low-temperature parts, the high-temperature parts, the low-temperature parts, and the high-temperature parts may be sequentially disposed in the third direction (Z-axis direction). More specifically, the plurality of thermoelectric elements 1300 and the plurality of jackets 1400 may be disposed between the adjacent fluid flow parts 1200. For example, the first through hole H1 of the fluid flow part 1200, the second substrate of the thermoelectric element 1300, the first substrate of the thermoelectric element 1300, the spaced jacket 1400, and the first substrate and the second substrate of the thermoelectric element 1300, which are adjacent to the thermoelectric element 1300 in the third direction (Z-axis direction), may be sequentially disposed in the third direction (Z-axis direction). Accordingly, the same substrates of the thermoelectric elements 1300 adjacent in the third direction (Z-axis direction) may be disposed to face each other. For example, the first substrates of the thermoelectric elements 1300 adjacent in the third direction (Z-axis direction) between the adjacent fluid flow parts 1200 may be positioned to face each other. Accordingly, the fluid flow part 1200 is a high-temperature part, and a region between the adjacent fluid flow parts 1200 is a low-temperature part, and thus heat exchange between the high-temperature part and the low-temperature part can be reduced to improve power generation performance.

In addition, as a modified embodiment, a length of a 2-1 through hole H21 in a direction perpendicular to a direction (second direction or third direction) perpendicular to a first direction (X-axis direction) may be smaller than or equal to a length in a direction perpendicular to a first surface M1 and greater than or equal to a length of a first through hole H1 in the direction perpendicular to the first direction (X-axis direction).

For example, a width W1 of the 2-1 through hole H21 in a third direction (Z-axis direction) may be smaller than or equal to a width Wa (see FIG. 5) of the first surface M1 in the third direction (Z-axis direction). In addition, the width W1 of the 2-1 through hole H21 in the third direction (Z-axis direction) may be greater than or equal to a width W3 of the first through hole H1 in the third direction (Z-axis direction).

In contrast, a length of a 2-2 through hole H22 in the direction perpendicular to the direction (second direction or third direction) perpendicular to the first direction (X-axis direction) may be smaller than or equal to a length in a direction perpendicular to a second surface M2 and smaller than or equal to a length of the first through hole H1 in the direction perpendicular to the first direction (X-axis direction).

For example, a width W2 of the 2-2 through hole H22 in the third direction (Z-axis direction) may be smaller than or equal to a width Wb (see FIG. 5) of the second surface M2 in the third direction (Z-axis direction). In addition, the width W2 of the second through hole H22 in the third direction (Z-axis direction) may be smaller than or equal to a width W3 of the first through hole H1 in the third direction (Z-axis direction).

According to such a structure, a fluid may sequentially pass through the 2-2 through hole H22, the first through hole H1, and the 2-1 through hole H21 while minimizing collisions with a frame or a fluid flow part. In other words, the length of each of the 2-2 through hole H22, the first through hole H1, and the 2-1 through hole H21 in the first direction may be reduced, and thus interruption on a flow of the fluid can be minimized. Accordingly, a heat conversion device according to the embodiment can minimize separation of the fluid flowing therein to improve reliability.

In addition, a length L1 of the 2-1 through hole H21 in a second direction (Y-axis direction) and a length L2 of the 2-2 through hole H22 in the second direction (Y-axis direction) may be smaller than or equal to a length La or Lb (see FIG. 5) of the first surface M1 or the second surface M2 in the second direction (Y-axis direction). In addition, the length L1 of the 2-1 through hole H21 in the second direction (Y-axis direction) and the length L2 of the 2-2 through hole H22 in the second direction (Y-axis direction) may be smaller than or equal to a length L3 of the first through hole H1 in the second direction (Y-axis direction). Accordingly, a phenomenon in which a fluid comes into contact with the frame and flows backward while flowing in the first direction can be inhibited. In addition, the fluid may not flow between the fluid flow part and the frame due to a generated differential pressure. Accordingly, the heat conversion device according to the embodiment can be free from moisture of the fluid, and thus reliability can be improved.

Figure 15:
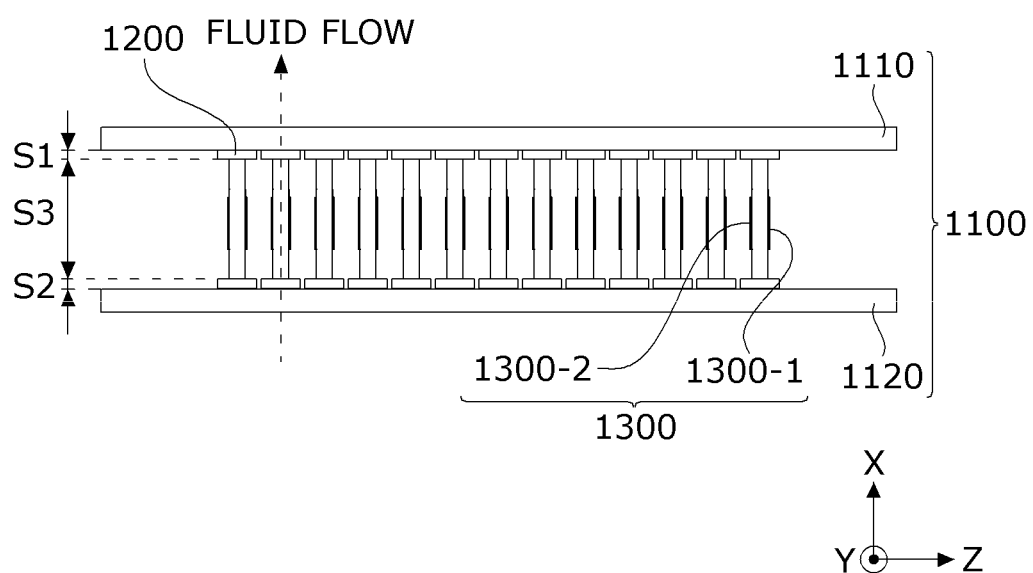
FIG. 15 is a top view illustrating a state in which a jacket is omitted in the heat conversion device according to the embodiment of the present invention.
Figure 16:
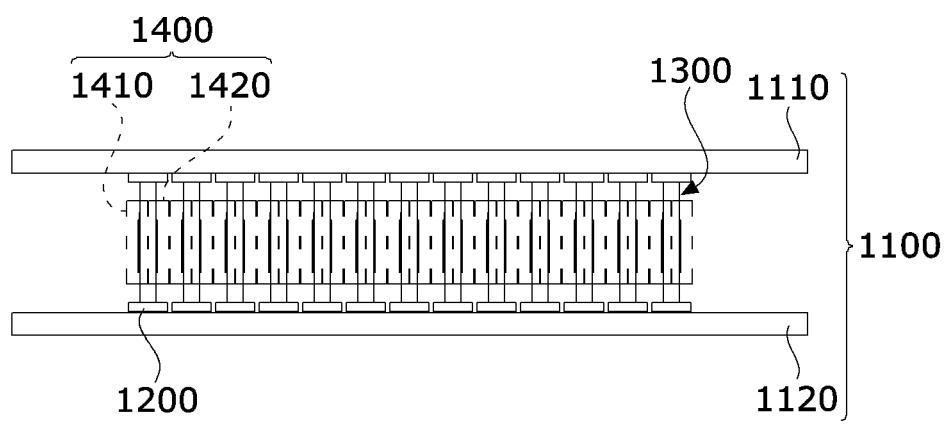
FIG. 16 is a top view illustrating the heat conversion device according to the embodiment of the present invention.

FIG. 15 is a top view illustrating a state in which the jacket is omitted in the heat conversion device according to the embodiment of the present invention, FIG. 16 is a top view illustrating the heat conversion device according to the embodiment of the present invention.

Referring to FIGS. 15 and 16, in the heat conversion device according to the embodiment, the plurality of thermoelectric elements 1300 and the jackets 1400 may be disposed in the third region S3. The plurality of thermoelectric elements overlapping in the third direction (Z-axis direction) may be positioned on one fluid flow part 1200. For example, a first thermoelectric element 1300-1 may be disposed at one side of the fluid flow part 1200 and a second thermoelectric element 1300-2 may be disposed at the other side. The first thermoelectric element 1300-1 and the second thermoelectric element 1300-2 may overlap in the third direction (Z-axis direction).

In addition, the first substrate of the first thermoelectric element 1300-1 and the first substrate of the second thermoelectric element 1300-2 may be in contact with the jackets 1400. For example, the first substrate of the first thermoelectric element 1300-1 may be in contact with the first jacket, and the first substrate of the second thermoelectric element 1300-2 may be in contact with the second jacket.

The third region S3 of the fluid flow part 1200, the first thermoelectric element 1300-1, and the second thermoelectric element 1300-2 may be disposed between the first jacket and the second jacket. In addition, the first jacket and the second jacket may be coupled to each other using various fastening methods. Accordingly, the first jacket and the second jacket may surround the third region S3 of the fluid flow part 1200, the first thermoelectric element 1300-1, and the second thermoelectric element 1300-2 disposed between the first jacket and the second jacket and press the third region S3 of the fluid flow part 1200, the first thermoelectric element 1300-1, and the second thermoelectric element 1300-2. According to such a structure, the reliability of the heat conversion device according to embodiments can be improved.

First regions S1 of the adjacent fluid flow parts 1200 may be disposed to be spaced apart from each other to form a space therebetween. Accordingly, since the adjacent fluid flow parts are not in contact with each other, heat transfer between the fluid flow parts is prevented, and thus heat transfer can be performed through only the first through hole of each of the fluid flow parts 1200. That is, heat of the fluid flow parts 1200 are uniform, and thus power generation performance can be improved.

Figure 17:
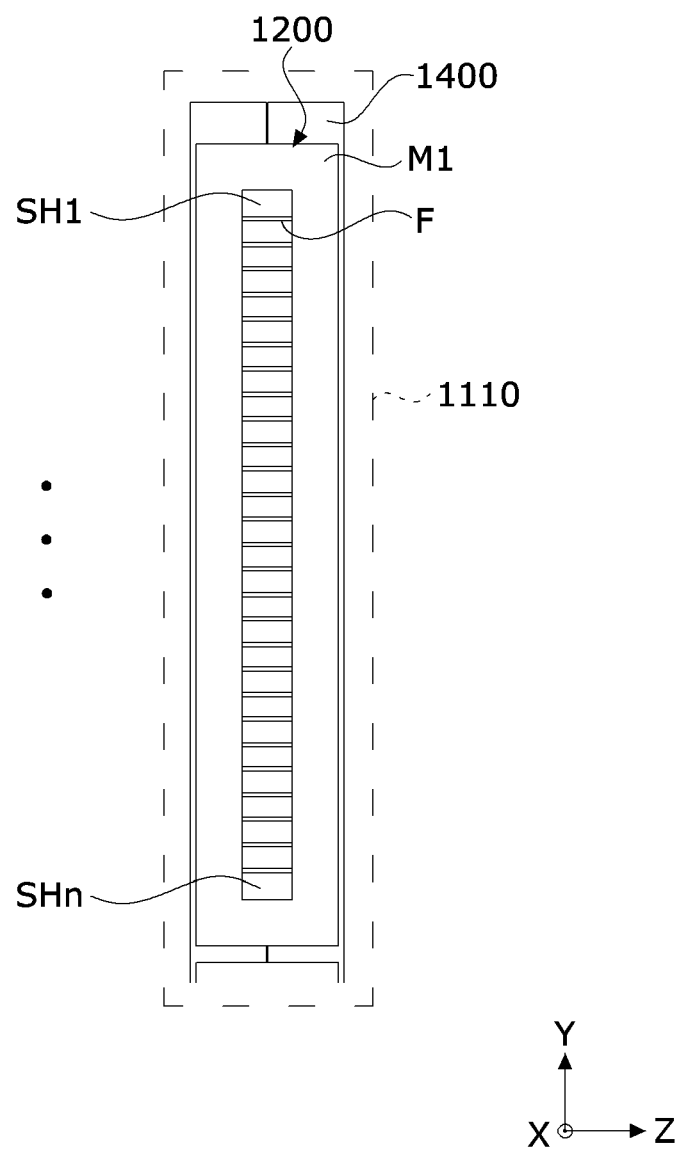
FIG. 17 is a front view illustrating a part of a heat conversion device according to another embodiment of the present invention.
Figure 18:
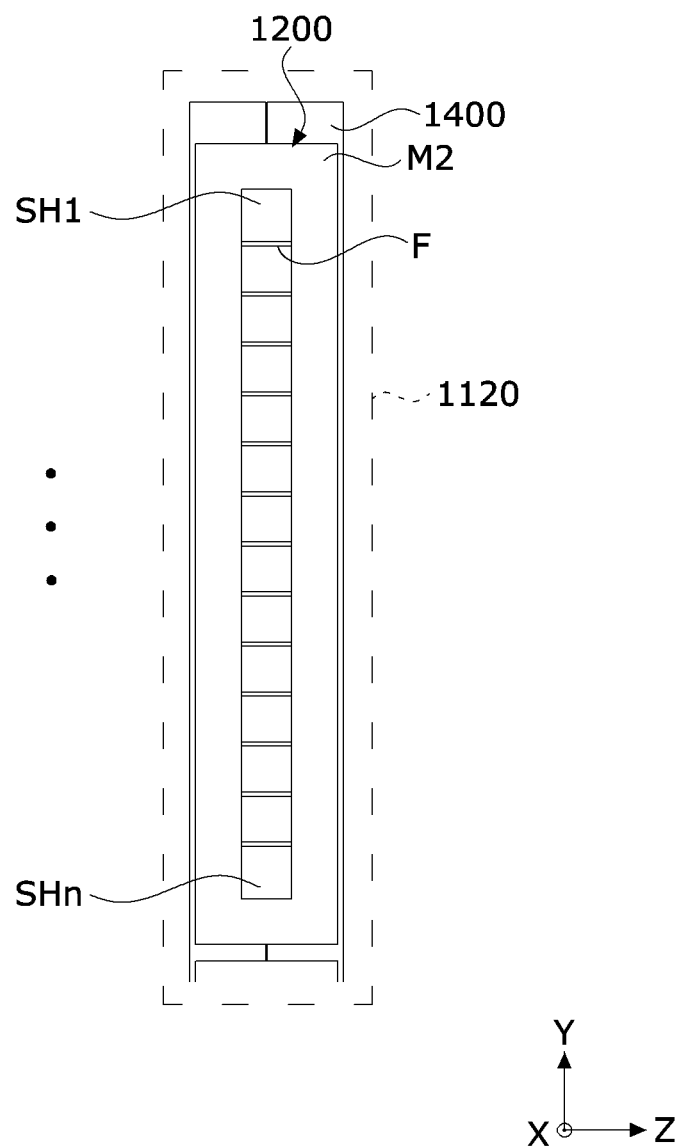
FIG. 18 is a rear view illustrating a part of the heat conversion device according to another embodiment of the present invention.
Figure 19:
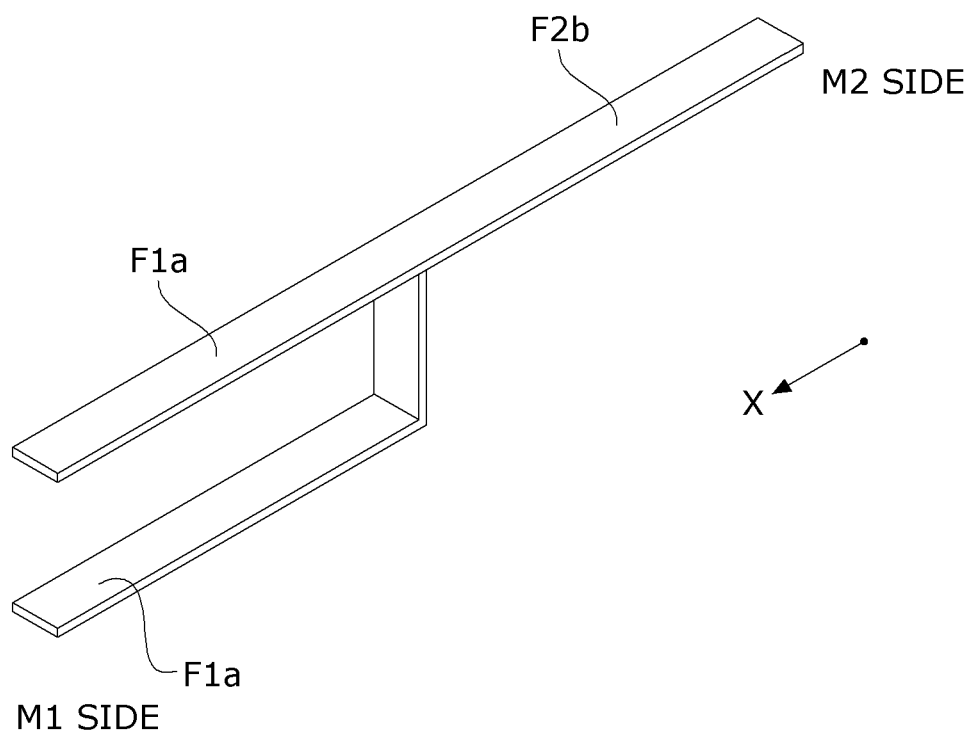
FIG. 19 is an exemplary view illustrating fins in the heat conversion device according to another embodiment of the present invention.

FIG. 17 is a front view illustrating a part of a heat conversion device according to another embodiment of the present invention, FIG. 18 is a rear view illustrating a part of the heat conversion device according to another embodiment of the present invention, and FIG. 19 is an exemplary view illustrating fins in the heat conversion device according to another embodiment of the present invention.

Referring FIGS. 17 to 19, the heat conversion device according to another embodiment of the present invention may include frames 1100, fluid flow parts 1200, thermoelectric elements 1300, jackets 1400, and a guide part 1500. In addition, the heat conversion device or each of the fluid flow part 1200 may include at least one fin F disposed in a first through hole to divide the first through hole into a plurality of sub through holes. The above-described content may be applied to the frame 1100, the fluid flow part 1200, the thermoelectric element 1300, the jacket 1400, and the guide part 1500 aside from content which will be described below.

In sub through holes SH divided by the at least one fin F in the heat conversion device according to another embodiment, the number of the sub through holes SH in a first surface M1 may be different from the number of the sub through holes SH in a second surface M2.

For example, the first through hole may include the sub through holes SH divided by the at least one fin. In addition, the number of the sub through holes SH in the first surface M1 may be greater than the number of the sub through holes SH in the second surface M2.

In the embodiment, there may be n sub through holes SH1 to SHn in the first surface M1 and m sub through holes SH1 to SHm in the second surface M2. In addition, n may be greater than m. That is, the number of the sub through holes may increase in a first direction.

In addition, the fin F (F2) may extend in the first direction (X-axis direction) from the second surface M2 and may be divided into a plurality of fins F (F1a) in the first surface M1. That is, the fin F may be branched off in the first direction (the X-axis direction). According to such a structure, even when a temperature of a fluid is lowered due to heat exchange with the fluid flow part 1200 while a fluid flows in the first direction (X-axis direction), a contact area with the fluid increases due to the fin, and thus the lowered temperature of the fluid due to the heat exchange can be compensated for. That is, heat may be uniformly provided from the fluid flow part 1200 in the first direction (X-axis direction) as a whole. That is, there may be a uniform temperature difference between the plurality of thermoelectric elements in contact with one fluid flow part 1200. Accordingly, the thermoelectric performance of the heat conversion device can be improved.

Figure 20:
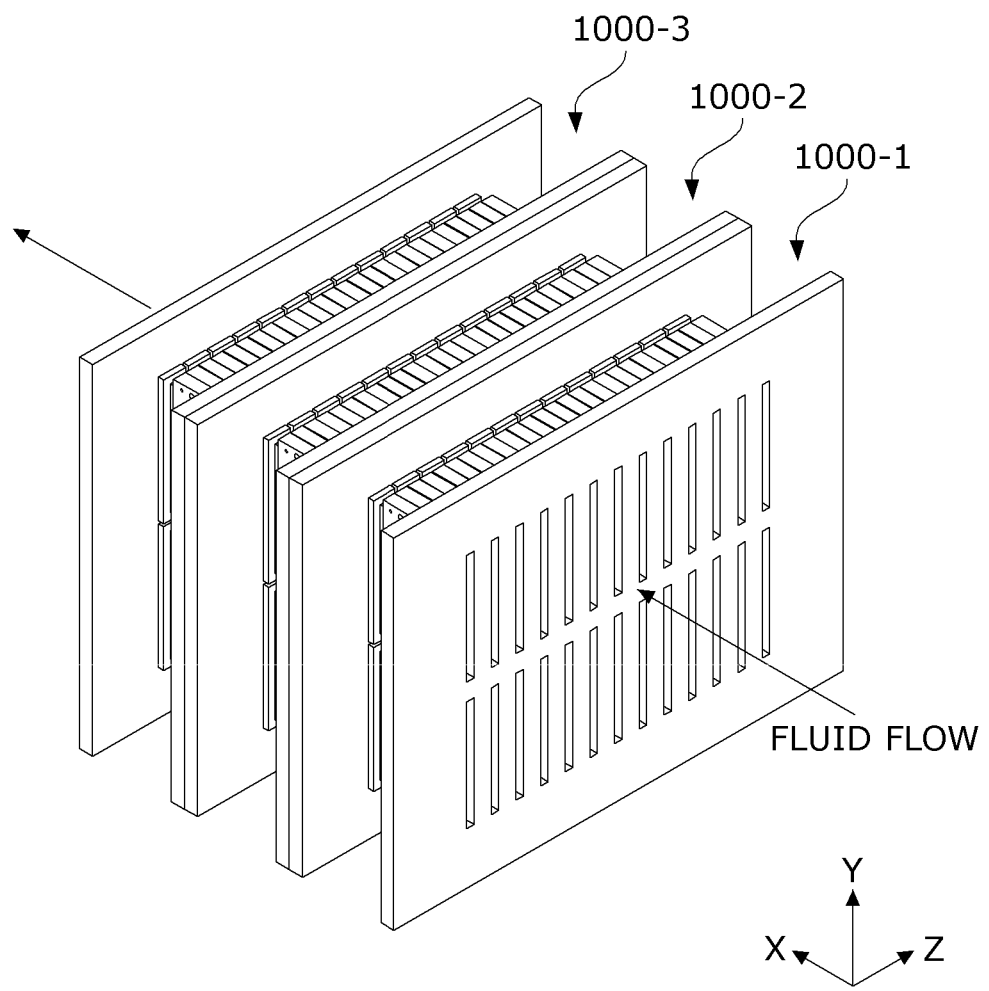
FIG. 20 is a perspective view illustrating a heat conversion device according to still another embodiment of the present invention.
Figure 21:
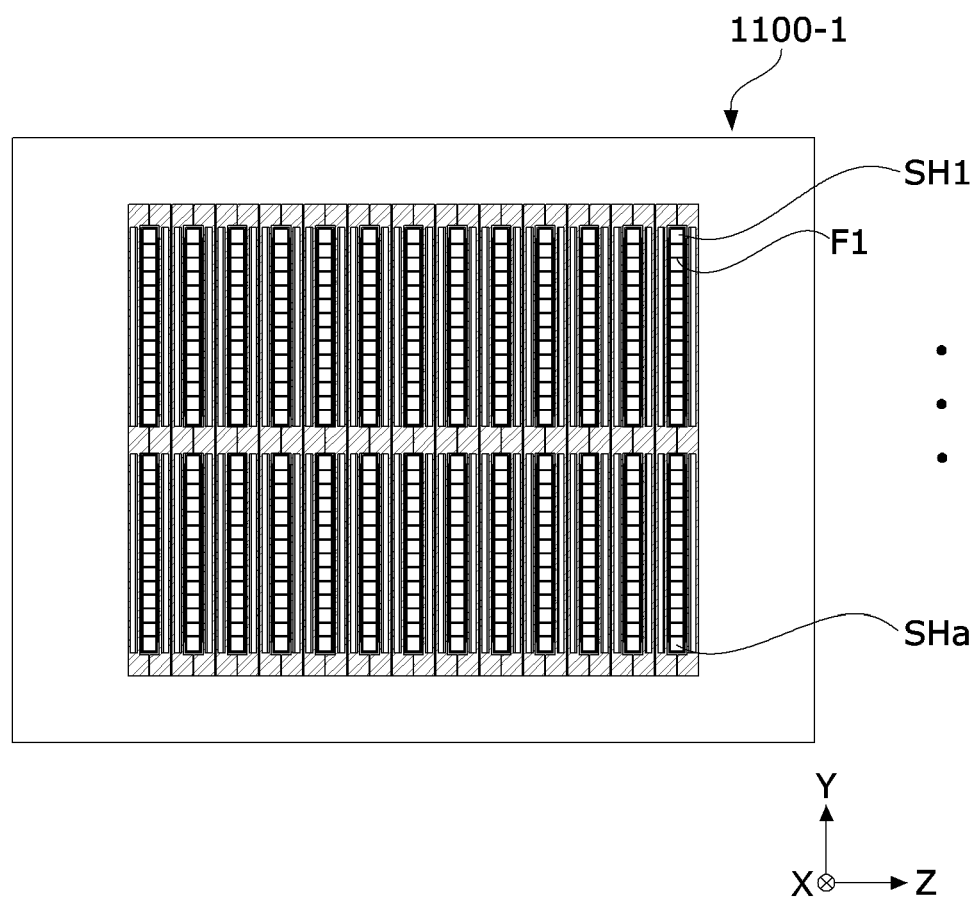
FIG. 21 is a cross-sectional view illustrating the heat conversion device along line KK' in FIG. 20.
Figure 22:
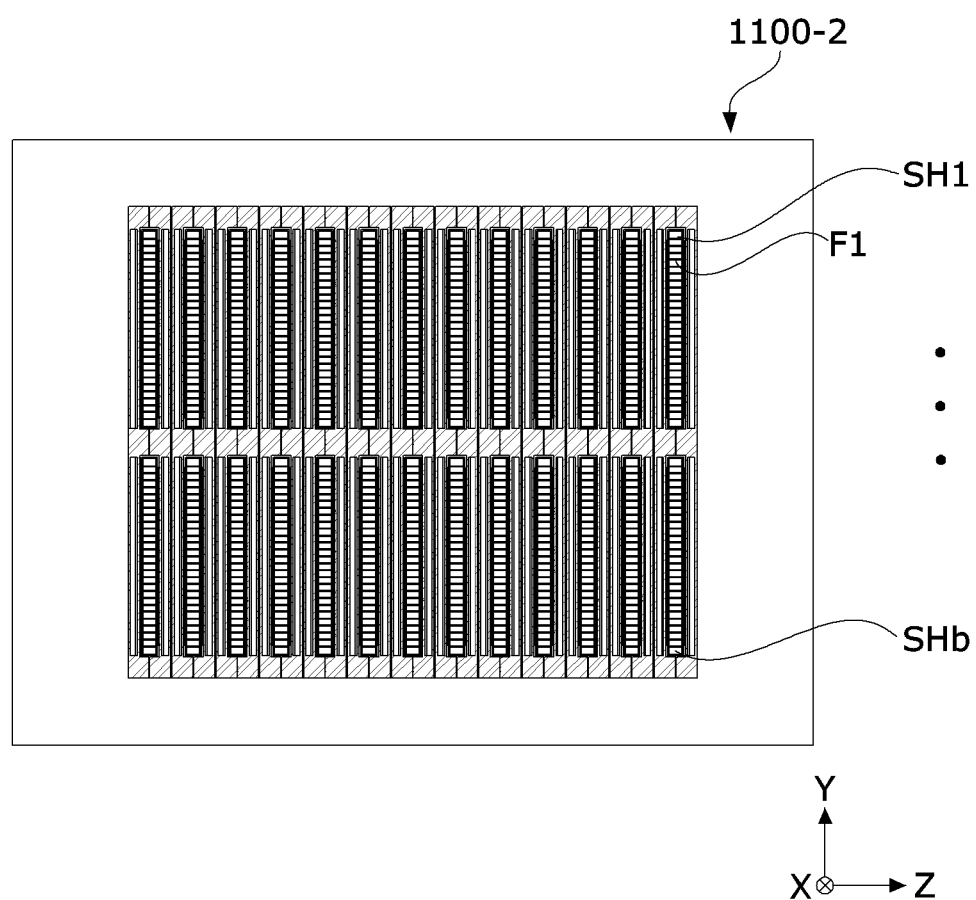
FIG. 22 is a cross-sectional view illustrating the heat conversion device along line LL' FIG. 20.
Figure 23:
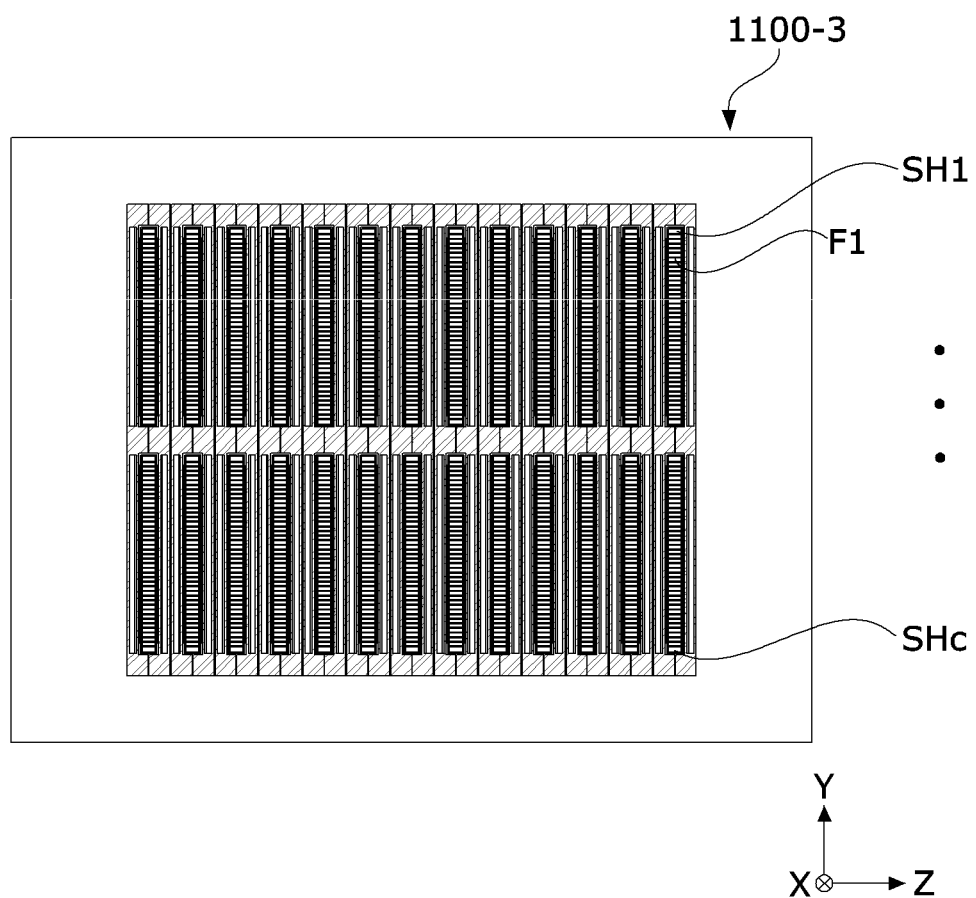
FIG. 23 is a cross-sectional view illustrating the heat conversion device along line MM' FIG. 20.

FIG. 20 is a perspective view illustrating a heat conversion device according to still another embodiment of the present invention, and FIG. 21 is a cross-sectional view illustrating the heat conversion device along line KK' in FIG. 20. FIG. 22 is a cross-sectional view illustrating the heat conversion device along line LL' in FIG. 20, and FIG. 23 is a cross-sectional view illustrating the heat conversion device along line MM' in FIG. 20.

Referring to FIGS. 20 to 23, the heat conversion device according to another embodiment may be a device including a plurality of above-described heat conversion devices. For example, the heat conversion device or heat conversion module according to still another embodiment may include a plurality of heat conversion devices 1000-1 to 1000-3. For example, in the heat conversion device according to still another embodiment, the plurality of heat conversion devices may include a first heat conversion device 1000-1, a second heat conversion device 1000-2, and a third heat conversion device 1000-3. In this case, each of the heat conversion devices may include a frame, a fluid flow part, a thermoelectric element, a jacket, and a guide part. In addition, the heat conversion device or the fluid flow part may include at least one fin F disposed in a first through hole to divide the first through hole into a plurality of sub through holes. The above-described content may be applied to the frame, the fluid flow part, the thermoelectric element, the jacket, and the guide part aside from content which will be described below.

In addition, the first heat conversion device 1000-1, the second heat conversion device 1000-2, and the third heat conversion device 1000-3 may be sequentially disposed in a first direction (X-axis direction). For example, a fluid may sequentially flow to the first heat conversion device 1000-1, the second heat conversion device 1000-2, and the third heat conversion device 1000-3.

In addition, each of the first heat conversion device 1000-1, the second heat conversion device 1000-2, and the third heat conversion device 1000-3 may include at least one fin. For example, the first heat conversion device 1000-1 may include a first fin F1, the second heat conversion device 1000-2 may include a second fin F2, and the third heat conversion device 1000-3 may include a third fin F3.

In addition, the first fin F1 may be positioned in the first through hole of the first heat conversion device 1000-1 to divide the first through hole into a plurality of sub through holes. The second fin F2 may be positioned in the first through hole of the second heat conversion device 1000-2 to divide the first through hole may be divided into the plurality of sub through holes. In addition, the third fin F3 may be positioned in the first through hole of the third heat conversion device 1000-3 to divide the first through hole into the plurality of sub through holes.

In this case, the number of first fins F1 may be greater than the number of second fins F2, and the number of second fins F2 may be greater than the number of third fins F3. That is, the plurality of heat conversion devices are disposed in the first direction (X-axis direction), and the number of the fins in each of the plurality of heat conversion devices may increase in the first direction (X-axis direction).

In addition, the first through hole of the first heat conversion device 1000-1 may be divided into sub through holes SH1 to SHa, the first through hole of the second heat conversion device 1000-2 may be divided into b sub through holes SH1 to SHb, and the first through hole of the third heat conversion device 1000-3 may be divided into c sub through holes SH1 to SHc. In this case, c may be greater than b, and b may be greater than a.

According to such a structure, even when a temperature of a fluid is lowered due to heat exchange with the fluid flow part 1200 while the fluid flows in the first direction (X-axis direction), a contact area with the fluid increases due to the fin in the first direction (X-axis direction), and thus the lowered temperature of the fluid due to the heat exchange can be compensated for. That is, heat may be uniformly provided from the fluid flow part 1200 or the heat conversion devices in the first direction (X-axis direction) as a whole. That is, there may be a uniform temperature difference between the plurality of thermoelectric elements in the plurality of heat conversion devices. Accordingly, the thermoelectric performance of the heat conversion device can be improved.

Table 1 below shows a temperature (average) of high-temperature parts and a temperature (average) of low-temperature parts in each of the first heat conversion device to the third heat conversion device of the numbers of the fins are the same and which are sequentially disposed in the first direction (X-axis direction).

TABLE 1

| Classification | Temperature at first heat conversion device [° C.] | Temperature at second heat conversion device [° C.] | Temperature at third heat conversion device [° C.] |
| --- | --- | --- | --- |
| Average temperature of high-temperature parts | 176.63 | 161.09 | 156.74 |
| Average temperature of low-temperature parts | 97.51 | 92.43 | 91.05 |
| Average Temperature difference (dT) | 79.12 | 68.66 | 65.70 |

Table 2 below shows a temperature (average) of the high-temperature parts and a temperature (average) of the low-temperature parts in each of the first heat conversion device to the third heat conversion device of which the numbers of the fins increase and which are sequentially disposed in the first direction (X-axis direction). In this case, the number of the fins in the second heat conversion device is twice the number of the fins in the first heat conversion device, and the number of the fins in the third heat conversion device is three times the number of the fins in the first heat conversion device.

TABLE 2

| Classification | Temperature at first heat conversion device [° C.] | Temperature at second heat conversion device [° C.] | Temperature at third heat conversion device [° C.] |
| --- | --- | --- | --- |
| Average temperature of high-temperature parts | 176.63 | 161.09 | 156.74 |
| Average temperature of low-temperature parts | 97.51 | 92.43 | 91.05 |
| Average Temperature difference (dT) | 79.12 | 68.66 | 65.70 |

Referring to Tables 1 and 2 above, it can be seen that a change in average of the temperature difference dT between the adjacent heat conversion devices decreases as the numbers of the fins of the heat conversion devices disposed in the first direction (X axis direction) increase. It can also be seen that a change in temperature average of the high-temperature part or temperature average of the low-temperature part between the adjacent heat conversion devices decreases as the numbers of the fins of the heat conversion devices disposed in the first direction (X axis direction) increase. That is, it can be seen that, even when a temperature a fluid is lowered due to heat exchange with the fluid flow part 1200 while the fluid flows in the first direction (X-axis direction), the lowered temperature of the fluid due to the heat exchange can be appropriately compensated for by increasing a contact area with the fluid using the fins in the first direction (X-axis direction) by increasing the number of the fins. In addition, heat may be uniformly provided from the fluid flow part 1200 or each of the heat conversion devices in the first direction (X-axis direction) as a whole. Accordingly, there may be a uniform temperature difference between the plurality of thermoelectric elements in the plurality of heat conversion devices, and the thermoelectric performance of the heat conversion device can be improved.

Figure 24:
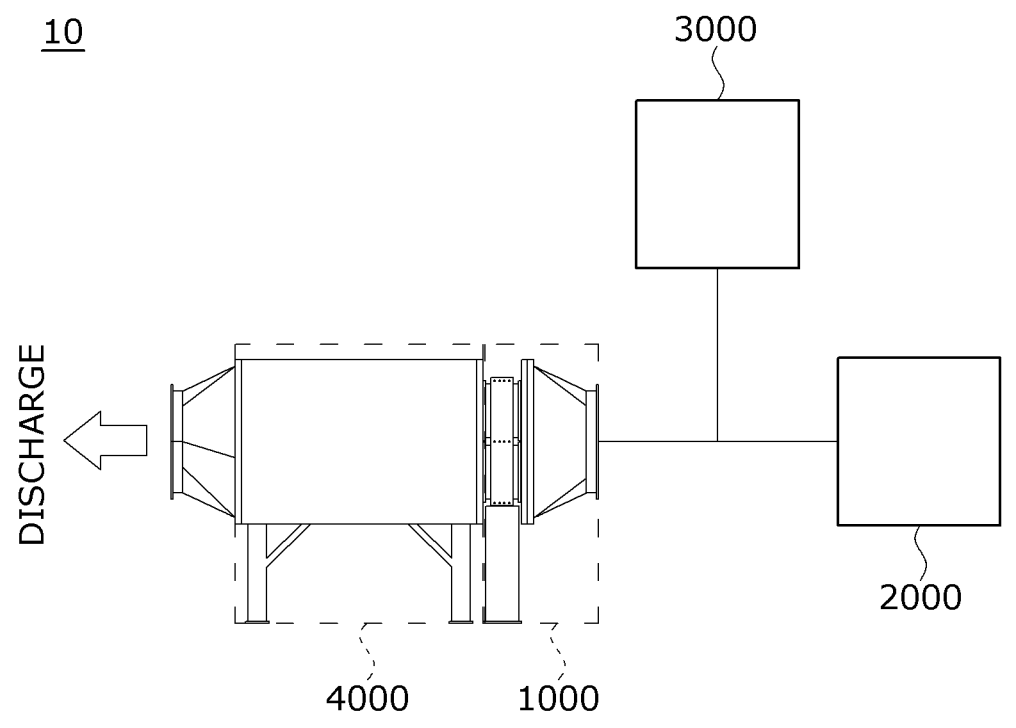

FIG. 24 is a block diagram illustrating a power generation system according to an embodiment of the present invention.

Referring to FIG. 24, a power generation system 10 according to the embodiment of the present invention may include a heat conversion device 1000, a power generation apparatus 2000, a bypass guide part 3000, and a heat recovery device 4000.

The heat conversion device 1000 may be equally applied to the heat conversion device 1000, and power can be generated using an inflow fluid.

The power generation apparatus 2000 may perform an electrochemical reaction and the like to generate electricity and heat. For example, the power generation apparatus 2000 may generate heat and may be coupled to a humidifier to provide a fluid (for example, steam). The power generation apparatus 2000 may output the fluid through the humidifier or the like and may be connected to the heat conversion device 1000 through a tube or pipe. Accordingly, the heat conversion device 1000 may receive the fluid having thermal energy generated from the power generation apparatus 2000.

The bypass guide part 3000 may be connected to a pipe disposed between the power generation apparatus 2000 and the heat conversion device 1000 to further provide a fluid flow path. For example, a fluid (for example, steam) may be discharged to the outside through the bypass guide part 3000 when hot water is not provided, or the heat conversion device 1000 and the heat recovery device 4000 are not operated or are repaired.

The heat recovery device 4000 may receive a fluid discharged from the heat conversion device 1000 and use the provided fluid to generate and discharge hot water. For example, the generated and discharged hot water may be provided to various users (homes, factories, and the like).

As described above, the power generation system 10 according to the embodiment may provide further improved energy efficiency by providing regeneration and hot water using heat generated by the power generation apparatus 2000.

The power generation system may generate power using heat generated by a vessel, a vehicle, a power plant, or the ground, and a plurality of power generation apparatuses may be arranged in order to effectively collect the heat. In this case, in each of the power generation apparatuses, a coupling force between a thermoelectric module and a fluid flow part may be increased to improve the cooling performance of a lower-temperature part of a thermoelectric element, accordingly, an efficiency and reliability of the power generation apparatus can be improved, and thus a fuel efficiency of a transportation apparatus such as a vessel or a vehicle can be improved. Accordingly, in the transportation industry, transportation costs can be reduced, an eco-friendly industrial environment can be created, and when the power generation apparatus is applied to the manufacturing industry such as a steel mill, material costs and the like can be reduced.

In addition, when the thermoelectric element or the thermoelectric module according to the embodiment of the present invention is used in a transportation apparatus such as a vessel or a vehicle, electricity can be generated using waste heat discharged from an discharge side of an engine, and generated energy can be charged in a battery or the like of the transportation apparatus and supplied to various devices, such as a lighting device, a gas circulation device, and the like, in the transportation apparatus. When the thermoelectric element according to the embodiment of the present invention is disposed at an intake side of an engine, the thermoelectric element according to the embodiment of the present invention may be used as not only a power generation apparatus but also a temperature control device. When the thermoelectric element according to the embodiment of the present invention is used as the temperature control device, a fuel efficiency of an engine can be improved by increasing an amount of gas injected into the engine by lowering a temperature of the gas injected into the engine. Accordingly, the engine in the transportation apparatus and the thermoelectric element according to the embodiment of the present invention may affect each other and have functional integration or technical interoperability.

In addition, in the shipping and transportation industries using a transportation apparatus to which the thermoelectric element according to the embodiment of the present invention is applied, transportation costs can be reduced and an eco-friendly industrial environment can be created due to the thermoelectric element according to the embodiment of the present invention, and thus functional integration or technical interoperability with the thermoelectric element according to the embodiment of the present invention can be achieved.

When the thermoelectric element according to the embodiment of the present invention is used in a power plant, an efficiency of used fuel to produce energy can be adjusted by using heat generated by the power plant as described above, accordingly, energy production costs and an eco-friendly industrial environment can be adjusted, and thus functional integration or technical interoperability can be achieved between the thermoelectric element according to the embodiment of the present invention and the power plant.

When the thermoelectric element according to the embodiment of the present invention is used in a plant such as a steel mill, energy consumed in the plant can be reduced by generating energy using electricity generated from waste heat generated in the plant, and when the thermoelectric element is used as a temperature control device, since the thermoelectric element controls a temperature in a product manufacturing process or in a plant to affect the other components in the plant, and thus functional integration or technical interoperability can be achieved between the thermoelectric element according to the embodiment of the present invention and the other components of the plant.

The thermoelectric element according to the embodiment of the present invention can be used as a temperature sensor of a wireless network or a small power supply for supplying energy to a sensor. That is, since the energy can be permanently supplied to the sensor or the like, when the thermoelectric element is used as the temperature sensor or the power supply device of the temperature sensor installed underground, functional integration or technical interoperability with the wireless network system can be achieved.

The thermoelectric element according to the embodiment of the present invention can be used as a temperature control device, and when the thermoelectric element is used in an electric vehicle, a battery charging device, or the like, functional integration or technical interoperability can be achieved using functions to improving the stability of the electric vehicle or the battery charging device by adjusting a temperature of the electric vehicle or the battery charging device.

While the present invention has been described with reference to the exemplary embodiments thereof, it will be understood by those skilled in the art that the present invention can be variously changed and modified without departing from the spirit and scope of the present invention defined by the appended claims below.

The invention claimed is:

1. A heat conversion device comprising:
   a frame including a plurality of second through holes;
   a fluid flow part coupled to the frame and including a plurality of first through holes, and
   at least one thermoelectric element connected to the frame,
   wherein the plurality of second through holes and the plurality of first through holes extend in a first direction and are disposed to correspond to each other,
   wherein a width of each of the plurality of second through holes is smaller than a width between closest through holes among the plurality of second through holes, wherein the fluid flow part includes a first surface and a second surface facing each other, wherein each first through hole passes through the first surface and the second surface, wherein a width of each second through hole in a third direction is greater than a width of the corresponding first through hole in the third direction, wherein a length of each second through hole in a second direction is greater than a length of the corresponding first through hole in the second direction, wherein the second direction is perpendicular to the first direction, and wherein the third direction is perpendicular to the second direction and the first direction.

2. The heat conversion device of claim 1, wherein the frame is in contact with the first surface or the second surface.

3. The heat conversion device of claim 1, wherein a length of each second through hole in the third direction is smaller than a length between adjacent second through holes in the second direction.

4. The heat conversion device of claim 1, wherein the frame includes:

a first frame in contact with the first surface; and a second frame in contact with the second surface, wherein the second through holes include a 2-1 through hole disposed in the first frame and a 2-2 through hole disposed in the second frame.

5. The heat conversion device of claim 4, wherein a length of the 2-1 through hole in a direction perpendicular to the first direction is equal to a length of the 2-2 through hole in the direction perpendicular to the first direction.

6. The heat conversion device of claim 1, wherein the thermoelectric element includes:

a first substrate in contact with one surface of the fluid flow part;

a second substrate disposed to be spaced apart from the first substrate;

a first electrode disposed on the first substrate;

a second electrode disposed under the second substrate; and a plurality of thermoelectric legs disposed between the first electrode and the second electrode, wherein the heat conversion device includes a jacket in contact with the first substrate, wherein a temperature of a first fluid passing through each first through hole is higher than a temperature of a second fluid positioned in the jacket, wherein the first fluid sequentially passes through the second through holes of the frame and then through the corresponding first through holes of the fluid flow part, wherein the jacket includes a first jacket disposed at one side of the fluid flow part and a second jacket disposed at an other side of the fluid flow part, and wherein the first jacket and the second jacket are disposed between the adjacent fluid flow parts and integrally formed.

7. The heat conversion device of claim 1, comprising at least one fin extending in the first direction and disposed respectively in each first through hole, wherein the first through holes include sub through holes divided by the at least one fin, and wherein a number of the sub through holes in the first surface is different from a number of the sub through holes in the second surface.

8. The heat conversion device of claim 7, wherein the number of the sub through holes increases in the first direction.

* * * * *